United States Patent
Yen

(10) Patent No.: US 7,365,666 B1
(45) Date of Patent: Apr. 29, 2008

(54) VOLTAGE CONVERSION DEVICE HAVING NON-LINEAR GAIN AND CHANGEABLE GAIN POLARITY

(75) Inventor: Chih-Jen Yen, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/685,207

(22) Filed: Mar. 13, 2007

(30) Foreign Application Priority Data

Oct. 26, 2006 (TW) .............................. 95139524 A

(51) Int. Cl.
*H03M 1/00* (2006.01)
(52) U.S. Cl. ...................................... 341/142; 341/155
(58) Field of Classification Search ......... 341/120–155
See application file for complete search history.

(56) References Cited

U.S. PATENT DOCUMENTS

| | | | |
|---|---|---|---|
| 5,534,864 A * | 7/1996 | Ono et al. .................. 341/156 |
| 6,275,177 B1 * | 8/2001 | Ho et al. .................... 341/143 |
| 6,288,664 B1 * | 9/2001 | Swanson .................... 341/155 |
| 6,414,619 B1 * | 7/2002 | Swanson .................... 341/155 |
| 6,566,905 B2 * | 5/2003 | Sanzo et al. ................. 326/37 |
| 6,707,492 B1 * | 3/2004 | Itani ........................ 348/229.1 |
| 2008/0007543 A1 * | 1/2008 | D'souza .................... 345/177 |

* cited by examiner

*Primary Examiner*—Lam T. Mai
(74) *Attorney, Agent, or Firm*—Winston Hsu

(57) ABSTRACT

A voltage conversion device having non-linear gain and changeable gain polarity includes a switch module, a gain decision module, a first voltage selection module, a second voltage selection module, a first switch unit, a second switch unit and a voltage output module. The switch module is used for outputting analog voltage provided by the analog voltage source or voltage corresponding to the system ground end. The gain decision module is used for determining a gain. The first voltage selection module is used for outputting a first DC voltage. The second voltage selection module is used for outputting a second DC voltage. The first switch unit is used for outputting the first DC voltage. The second switch unit is used for outputting the second DC voltage. The voltage output module is used for outputting an amplified result of a DC voltage according to the gain.

22 Claims, 29 Drawing Sheets

| POLB | POL | D1 | D0 | Selected Resistor |
|---|---|---|---|---|
| 0 | 1 | 1 | 1 | R(14) |
| 1 | 0 | 1 | 1 | R(4) |
| 0 | 1 | 1 | 0 | R(13) |
| 1 | 0 | 1 | 0 | R(3) |
| 0 | 1 | 0 | 1 | R(12) |
| 1 | 0 | 0 | 1 | R(2) |
| 0 | 1 | 0 | 0 | R(11) |
| 1 | 0 | 0 | 0 | R(1) |

Fig. 18

| POLB | POL | Decoding module ouput | Selected Resistor |
|---|---|---|---|
| 0 | 1 | D(1) enabled | R(1) |
| 1 | 0 | D(1) enabled | R(11) |
| 0 | 1 | D(2) enabled | R(2) |
| 1 | 0 | D(2) enabled | R(12) |
| 0 | 1 | D(3) enabled | R(3) |
| 1 | 0 | D(3) enabled | R(13) |
| 0 | 1 | D(4) enabled | R(4) |
| 1 | 0 | D(4) enabled | R(14) |

Fig. 20

| D1 D0 | Selected resistor | Selected DC voltage |
|---|---|---|
| 0 0 | R(1) | Vdc5 |
| 0 1 | R(2) | Vdc6 |
| 1 0 | R(3) | Vdc7 |
| 1 1 | R(4) | Vdc8 |

Fig. 26

| Selected resistor | Selected DC voltage |
|---|---|
| D(1) Enabled R(1) | Vdc5 |
| D(2) Enabled R(2) | Vdc6 |
| D(3) Enabled R(3) | Vdc7 |
| D(4) Enabled R(4) | Vdc8 |

Fig. 28

VOLTAGE CONVERSION DEVICE HAVING NON-LINEAR GAIN AND CHANGEABLE GAIN POLARITY

BACKGROUND OF THE INVENTION

1. Field of the Invention

The present invention relates to a voltage conversion device, and more particularly, to a voltage conversion device having non-linear gain and changeable gain polarity.

2. Description of the Prior Art

A liquid crystal display (LCD) monitor has characteristics of light shape, low power consumption, zero radiation, etc. and has been widely used in many information technology (IT) products, such as computer systems, mobile phones, and personal digital assistants (PDAs). The operating principle of the LCD is based on a property that liquid crystals in different twist status can exert different polarization and refraction effects on light. Thus, the liquid crystals arranged in different twist status control penetration amount of light so that various intensity of output light and red, green and blue lights in diverse gray levels can be produced.

Please refer to FIG. 1. FIG. 1 is a schematic diagram of a thin-film-transistor (TFT) LCD monitor 10 according to the prior art. The LCD monitor 10 includes an LCD panel 100, a control circuit 102, a data-line-signal output circuit 104, a scan-line-signal output circuit 106, and a voltage generator 108. The LCD panel 100 is formed with two substrates, and there are LCD layers stuffed between the substrates. One substrate includes a plurality of data lines 110, a plurality of scan lines (or gate lines) 112 vertical to the data lines 110, and a plurality of TFTs 114. The other substrate includes a common electrode for providing a common voltage Vcom generated by the voltage generator 108. For the sake of brevity, FIG. 1 only reveals four TFTs 114, but in a real case, each of TFTs 114 is set at an intersection of a data line 110 and a scan line 112 on the LCD panel 100. In other words, the plurality of TFTs 114, each corresponding to a pixel, form a matrix on the LCD panel 100, and thereby the data lines 110 and the scan lines 112 are corresponding to columns and rows of the matrix. In addition, a circuit effect resulted from the two substrates of the LCD panel 100 can be regarded as equivalent capacitors 116.

A driving process of the prior art TFT LCD monitor 10 is described in detail as follows. When the control circuit 102 receives a horizontal synchronization signal 118 and a vertical synchronization signal 120, the control circuit 102 generates corresponding control signals for the data-line-signal output circuit 104 and the scan-line-signal output circuit 106. The data-line-signal output circuit 104 and the scan-line-signal output circuit 106 generate input signals for the data lines 110 and the scan lines 112 according to the control signals, in order to control the TFTs 114 and voltage differences of the equivalent capacitors 116. The voltage differences change twist of liquid crystals and corresponding penetration amount of light, so as to display the display data 122 on a panel. For example, the scan-line-signal output circuit 106 outputs a pulse wave for turning on a TFT 114, and signals of a corresponding data line 110 outputted from the data-line-signal output circuit 104 can pass through the TFT 114 to a corresponding equivalent capacitor 116, so as to control a gray level of corresponding pixel. Besides, controlling signal levels of the signals on the data line 110 outputted from the data-line-signal output circuit 104 can drive gray levels of corresponding pixels.

In the prior art, in order to reduce EMI and save power under high-frequency operations, voltage swing outputted from the display data 122 is expected to be small, i.e., 0.1V~1V. Therefore, signals inputted to the data-line-signal output circuit 104 need to pass through a voltage conversion circuit, which adjusts the voltage swing of the inputted signals to a predetermined range, so as to control chrominance and luminance of corresponding pixels. For example, please refer to FIG. 2, which is a schematic diagram of a voltage conversion circuit 20 according to the prior art. The voltage conversion circuit 20 includes an operational amplifier 200 and resistors 202, 204. The operational amplifier 200 has an input end 206 coupled to an output end of the display data 122, and an output end 208 coupled to an input end of the data-line-signal output circuit 104. As those skilled in the art recognized, if the operational amplifier 200 is an ideal operational amplifier, which has an infinite gain, and resistance of the resistors 202, 204 are R1 and R2, the gain of the voltage conversion circuit 20 can be derived as a value, (1+R2/R1). In other words, the relation between the input and output voltages of the voltage conversion circuit 20 is corresponding to a linear function.

Therefore, data signals outputted from the display data 122 are amplified via the voltage conversion circuit 20 and then are outputted to the data-line-signal output circuit 104. Under this circumstance, via the voltage conversion circuit 20 of the prior art, data-line signals outputted from the data-line-signal output circuit 104 are linearly amplified to an operating range of the TFTs 114, so that the relation between the gray level and brightness displayed on the TFT LCD monitor 10 is approximate to a linear line, which effects color gradient of images and results in unnatural display images.

Besides, regarding LCD monitors, an event related to necessity of inverting polarity of output voltage also has to be taken into consideration. For an LCD monitor, continuously using a positive or negative polarity voltage to drive liquid crystals will decrease ability of the liquid crystals to polarize or reflect light, which makes image quality worse. Thus, in order to prevent the liquid crystals from breakage resulted from the driving voltage, using the positive and negative polarity voltages to alternately drive the liquid crystals is required. Furthermore, in addition to the equivalent capacitors, the circuit itself produces parasitic capacitors. When an image is displayed on the LCD panel for a long time, the parasitic capacitors may result in a residual image effect due to storage charge and further affect the follow-up image displaying. Therefore, the positive and negative polarity voltages must drive the liquid crystals in an alternate manner, such as methods of line inversion, dot inversion, and etc., so as to improve the effect mentioned above. That is to say, polarity of the data-line signals outputted from the data-line-signal output circuit can be inverted timely to prevent from the residual image effect or breakage of the liquid crystals.

Therefore, the voltage conversion circuit 20 of the prior art linearly amplifies the signals outputted by the display data 122, so that the relation between the gray levels and brightness displayed by the TFT LCD monitor 10 is approximate to a linear function, resulting in bad color gradient and unnatural images. Besides, the voltage conversion circuit 20 cannot provide a driving operation of alternating the positive and negative polarity voltages for inverting the data-line signals outputted from the data-line-signal output circuit 104. Therefore, problems of the residual image effect and breakage of the liquid crystals may easily occur in the TFT LCD monitor 10.

SUMMARY OF THE INVENTION

It is therefore a primary object of the present invention to provide a voltage conversion device having non-linear gain and changeable gain polarity.

The present invention discloses a voltage conversion device having non-linear gain and changeable gain polarity, for converting analog voltage provided by an analog voltage source. The voltage conversion device includes a switch module, a gain decision module, a first voltage selection module, a second voltage selection module, and a voltage output module. The switch module is coupled to the analog voltage source and a system ground end and is used for outputting analog voltage provided by the analog voltage source or voltage corresponding to the system ground end according to a polarity selection signal. The gain decision module includes an analog-to-digital (A/D) converter and a gain selector. The A/D converter is coupled to the analog voltage source and is used for converting analog voltage provided by the analog voltage source into digital signals. The gain selector is coupled to the A/D converter and the switch module and is used for determining a gain according to the digital signals outputted from the A/D converter. The first voltage selection module is coupled to the A/D converter and is used for outputting a first direct-current (DC) voltage selected from a plurality of DC voltages according to the digital signals outputted from the A/D converter. The second voltage selection module is coupled to the analog voltage source and the A/D converter and is used for outputting a second DC voltage selected according to analog voltage provided by the analog voltage source, a plurality of DC voltages and the digital signals outputted from the A/D converter. The first switch unit is coupled to the first voltage selection module and is used for outputting the first DC voltage according to the polarity selection signal. The second switch unit is coupled to the second voltage selection module and is used for outputting the second DC voltage according to the polarity selection signal. The voltage output module has a first input end, an output end coupled to the gain selector, and a second input end coupled to the first switch unit and the second switch unit. The voltage output module is used for outputting an amplified result of the DC voltage received by the second input end according to the gain determined by the gain selector.

The present invention further discloses a voltage conversion device having non-linear gain and changeable gain polarity, for converting analog voltage provided by an analog voltage source. The voltage conversion device includes a switch module, a gain decision, and a voltage output module. The switch module is coupled to the analog voltage source and a plurality of direct-current (DC) voltage sources. Besides, the switch module has a first output end and a second output end and is used for determining to output analog voltage provided by the analog voltage source from the first output end and one of the DC voltage sources from the second output end, or to output one of the DC voltage sources from the first output end and analog voltage provided by the analog voltage source from the second output end according to a polarity selection signal. The gain decision module includes an analog-to-digital (A/D) converter and a gain selector. The A/D converter is coupled to the analog voltage source and is used for converting analog voltage provided by the analog voltage source into digital signals. The gain selector is coupled to the A/D converter and the first output end of the switch module and is used for determining a gain according to the digital signals outputted from the A/D converter and voltage outputted from the first output end of the switch module. The voltage output module includes a first input end, an output end coupled to the gain selector, and a second input end coupled to the second output end of the switch module. In addition, the voltage output module is used for outputting an amplified result of the DC voltage received by the second input end according to the gain determined by the gain selector.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 18 is a truth table of the gain selector according to FIG. 17.

FIG. 20 is a truth table of the gain selector according to FIG. 19.

FIG. 26 is a truth table of the second voltage selection module according to FIG. 25.

FIG. 28 is a truth table of the second voltage selection module according to FIG. 27.

DETAILED DESCRIPTION

Figure 1:
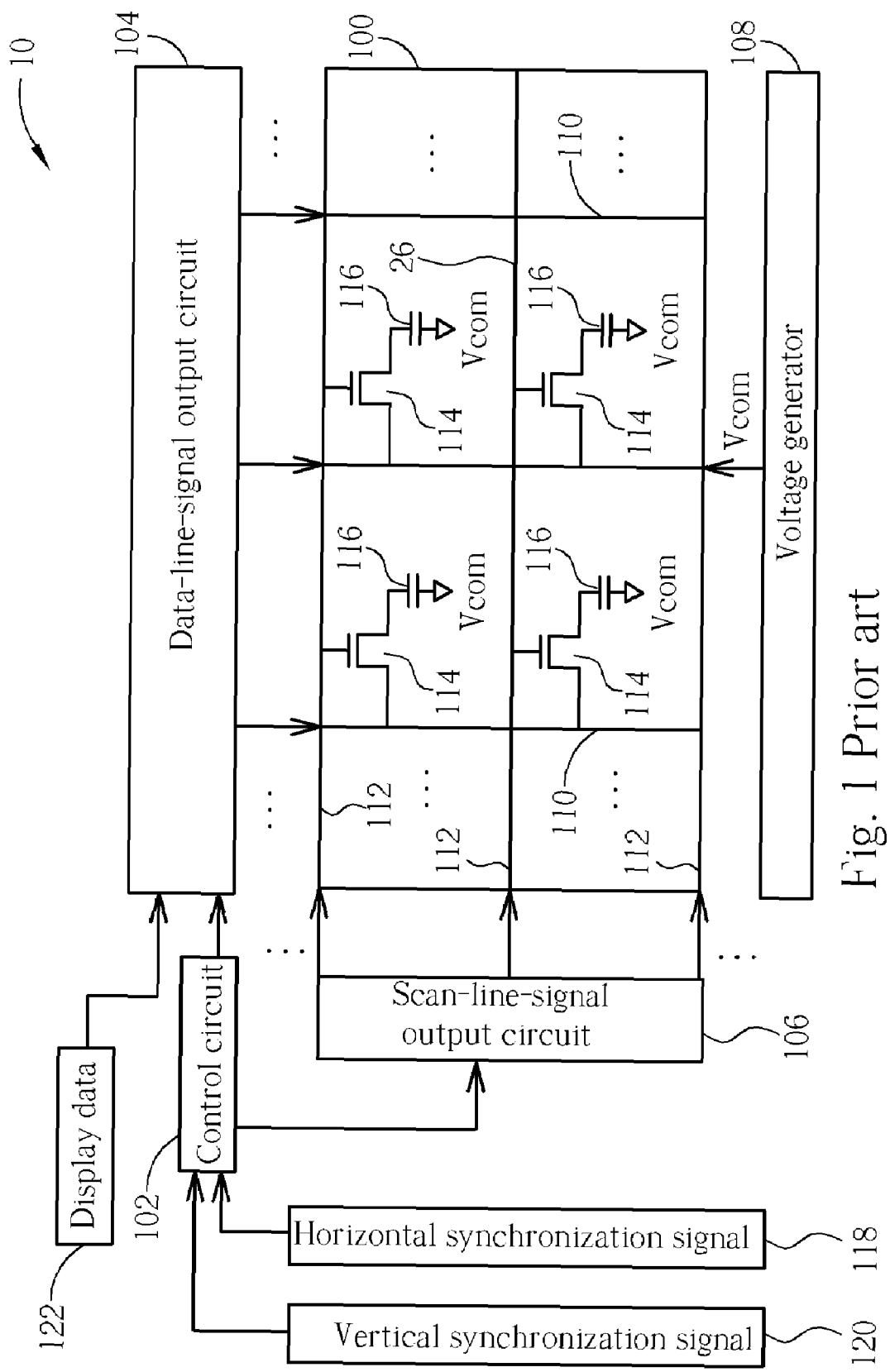
FIG. 1 is a schematic diagram of a thin-film-transistor (TFT) LCD according to the prior art.
Figure 2:
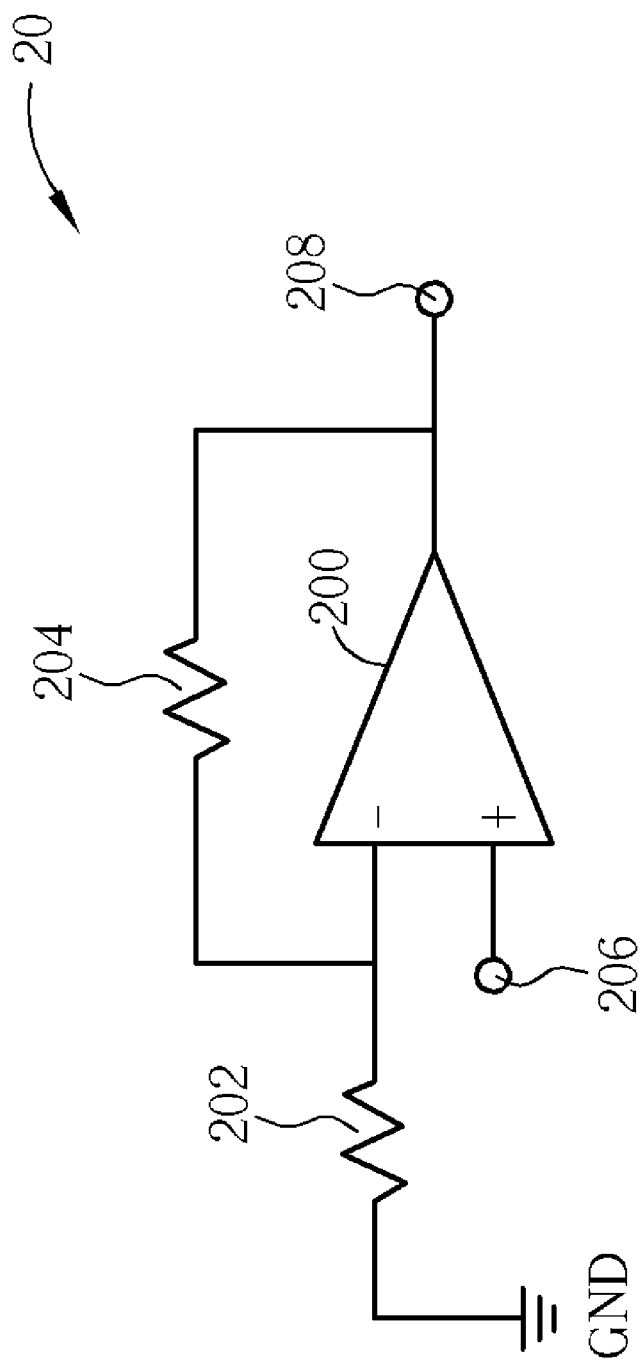
FIG. 2 is a schematic diagram of a voltage conversion circuit according to the prior art.
Figure 3:
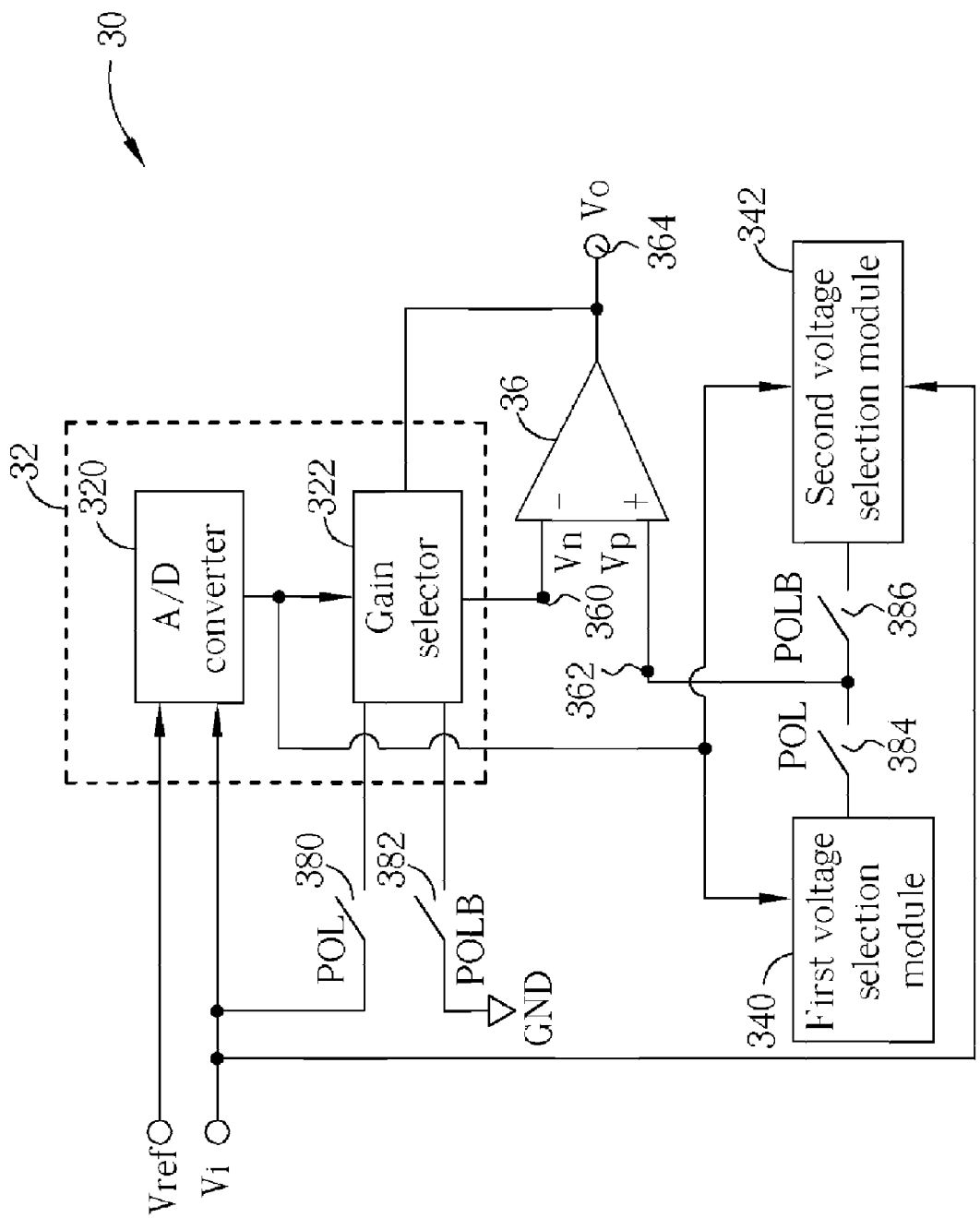
FIG. 3 is a schematic diagram of a voltage conversion device according to an embodiment of the present invention.

Please refer to FIG. 3, which is a schematic diagram of a voltage conversion device 30 according to an embodiment of the present invention. The voltage conversion device 30 is used for converting an analog voltage Vi provided by an analog voltage source, which can be display data of a flat panel display. The voltage conversion device 30 includes a gain decision module 32, a first voltage selection module 340, a second voltage selection module 342, a voltage output module 36, and switch units 380, 382, 384, and 386. The gain decision module 32 includes an analog-to-digital (A/D) converter 320 and a gain selector 322, and is used for dynamically selecting a gain according to the analog voltage Vi. The A/D converter 320 is used for converting the analog voltage Vi into digital signals. The gain selector 322 is used for determining a gain according to the digital signals outputted from the A/D converter 320. The first voltage selection module 340 is used for outputting a direct-current (DC) voltage, which is selected from a plurality of DC voltages, to the switch unit 384 according to the digital signals outputted from the A/D converter 320. The second voltage selection module 342 is used for outputting a DC voltage to the switch unit 386 according to the analog voltage Vi, a plurality of DC voltages, and the digital signals outputted from the A/D converter 320. The voltage output module 36 is preferably a negative feedback circuit composed of operational amplifiers. The voltage output module 36 includes a first input end 360, a second input end 362, and an output end 364, and is used for amplifying a DC voltage outputted from the switch unit 384 or the switch unit 386 according to the gain determined by the gain selector 322. In other words, the gain decision module 32 is used for determining a gain of an output voltage Vo outputted from the voltage output module 36 versus voltage received by the second input end 362 of the output module 36, while the plurality of DC voltages are used for determining a shift amount of the output voltage Vo.

In order to clearly explain the embodiment of the present invention, architecture of each module of the voltage conversion device 30 is described in detail in advanced of operations thereof.

Figure 4:
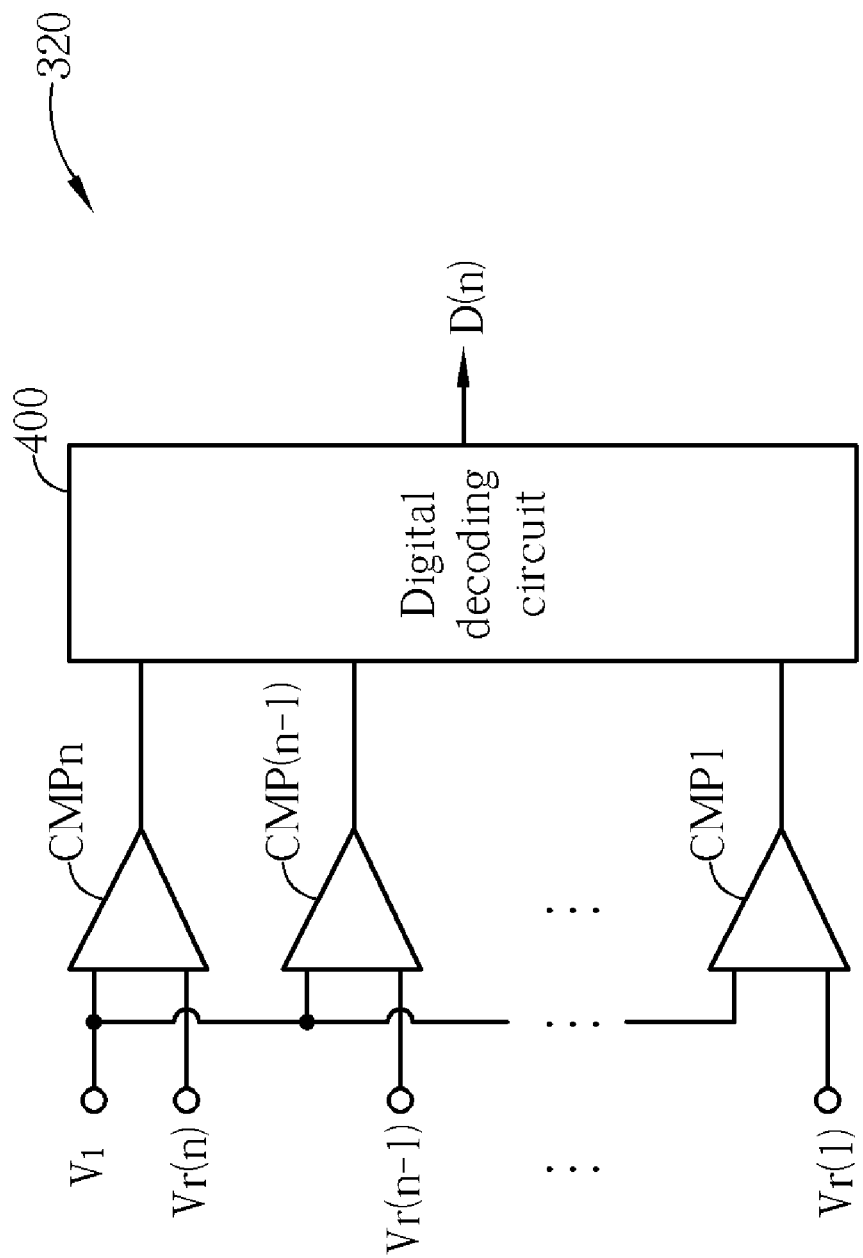
FIG. 4 is a schematic diagram of an A/D converter.

Firstly, please refer to FIG. 4, which is a schematic diagram of an A/D converter 320. The A/D converter 320 includes comparators CMP1~CMPn and a digital decoding circuit 400. The comparators CMP1~CMPn are used for comparing the analog voltage Vi and reference voltages Vr(1)~Vr(n), and outputting a comparison result to the digital decoding circuit 400. The digital decoding circuit 400 outputs a digital signal D(n) according to the comparison result outputted by the comparators CMP1~CMPn.

Figure 5:
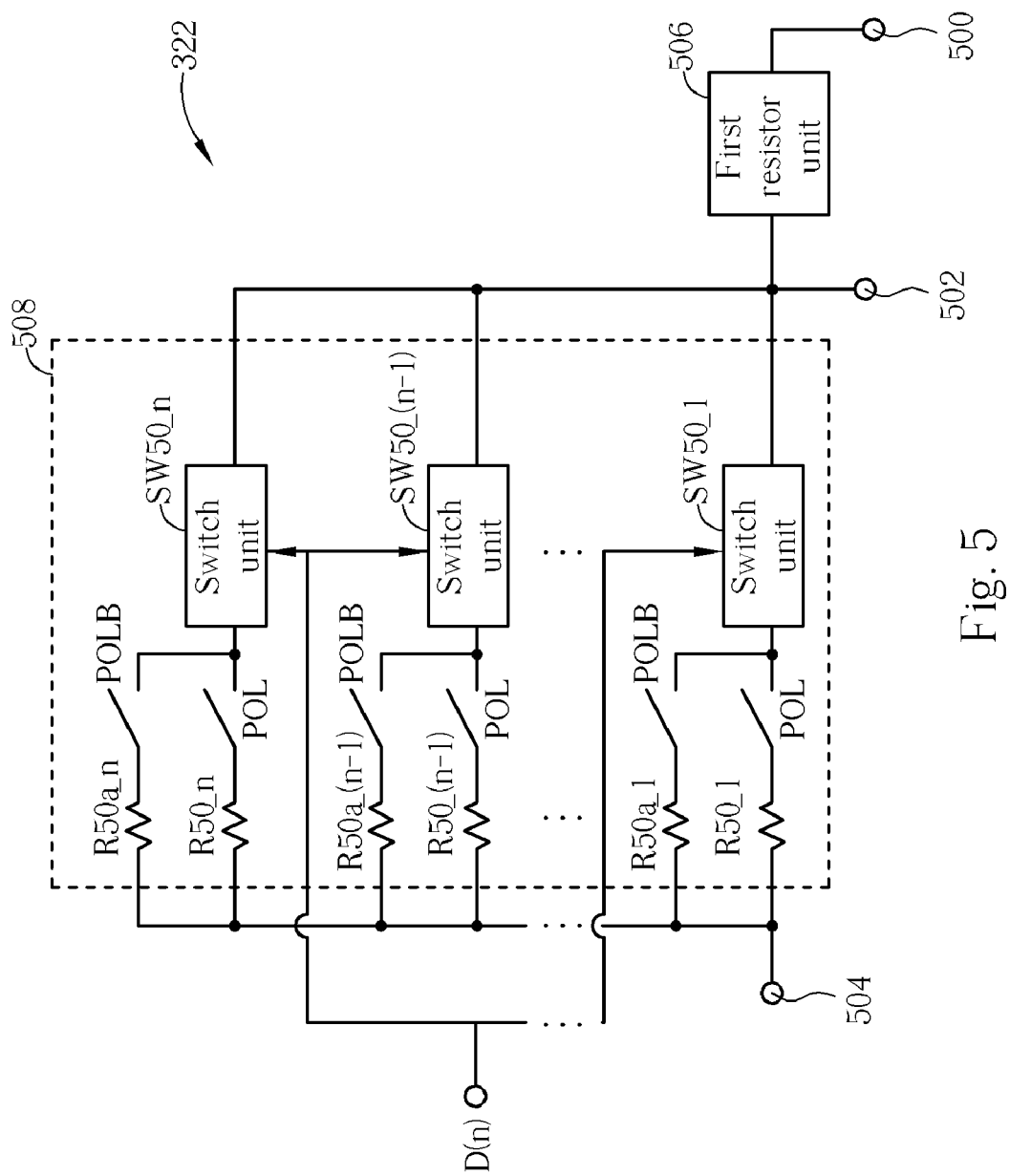
FIG. 5 is a schematic diagram of a gain selector.

Please refer to FIG. 5, which is a schematic diagram of the gain selector 322. The gain selector 322 includes a first signal end 500, a second signal end 502, a third signal end 504, a first resistor unit 506, and a resistance decision module 508. The first signal end 500 is coupled to the output end 364 of the voltage output module 36, while the second signal end 502 is coupled to the first input end 360 of the voltage output module 36. Besides, the third signal end 504 is coupled to the switch units 380 and 382. The first resistor unit 506 can be a resistor having a fixed resistance or variable resistances, and is coupled between the first signal end 500 and the second signal end 502. The resistance decision module 508 determines resistance between the second signal end 502 and the third signal end 504 via resistors R50_1~R50_$n$ and switch units SW50_1~SW50_$n$ according to the digital signal D(n) outputted from the A/D converter 320. Each of the resistors R50_1~R50_$n$ and R50a_1~R50a_$n$ is coupled to the third signal end 504, while the switch units SW50_1~SW50_$n$ conducts a connection between a resistor of the resistors R50_1~R50_$n$, R50a_1~R50a_$n$ and the second signal end 502 according to the polarity selection signal and the digital signal D(n) outputted from the A/D converter 320.

Figure 6:
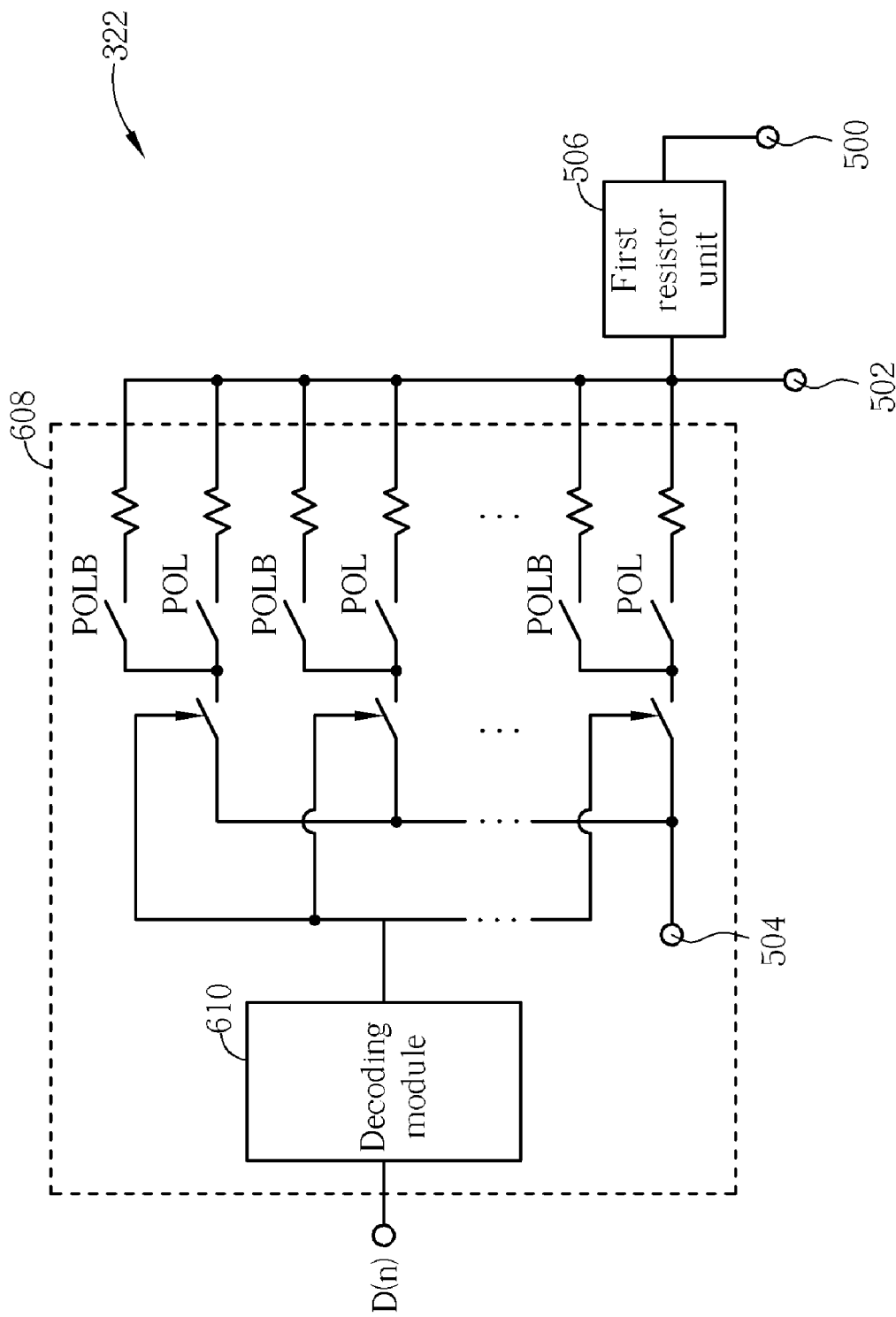
FIG. 6 is a schematic diagram of a gain selector.

In FIG. 5, each of the switch units SW50_1~SW50_$n$ includes a specified amount of switches, which is equal to a bit number of the digital signal D(n). However, in some applications, the digital signal D(n) comprises more bits such that each of the switch units SW50_1~SW50_$n$ relatively comprises more switches, which increases circuit complexity. Therefore, the embodiment of the present invention further provides a resistance decision module 608 for replacing the resistance decision module 508. Please refer to FIG. 6. The operating principle of the resistance decision module 608 is similar to that of the resistance decision module 508 in FIG. 5. In FIG. 6, the digital signal D(n) outputted from the A/D converter 320 passes through a decoding module 610 to a corresponding switch. Under this circumstance, the resistance decision module 608 employs fewer switches than the resistance decision module 508 does, which can reduce production cost.

Figure 7:
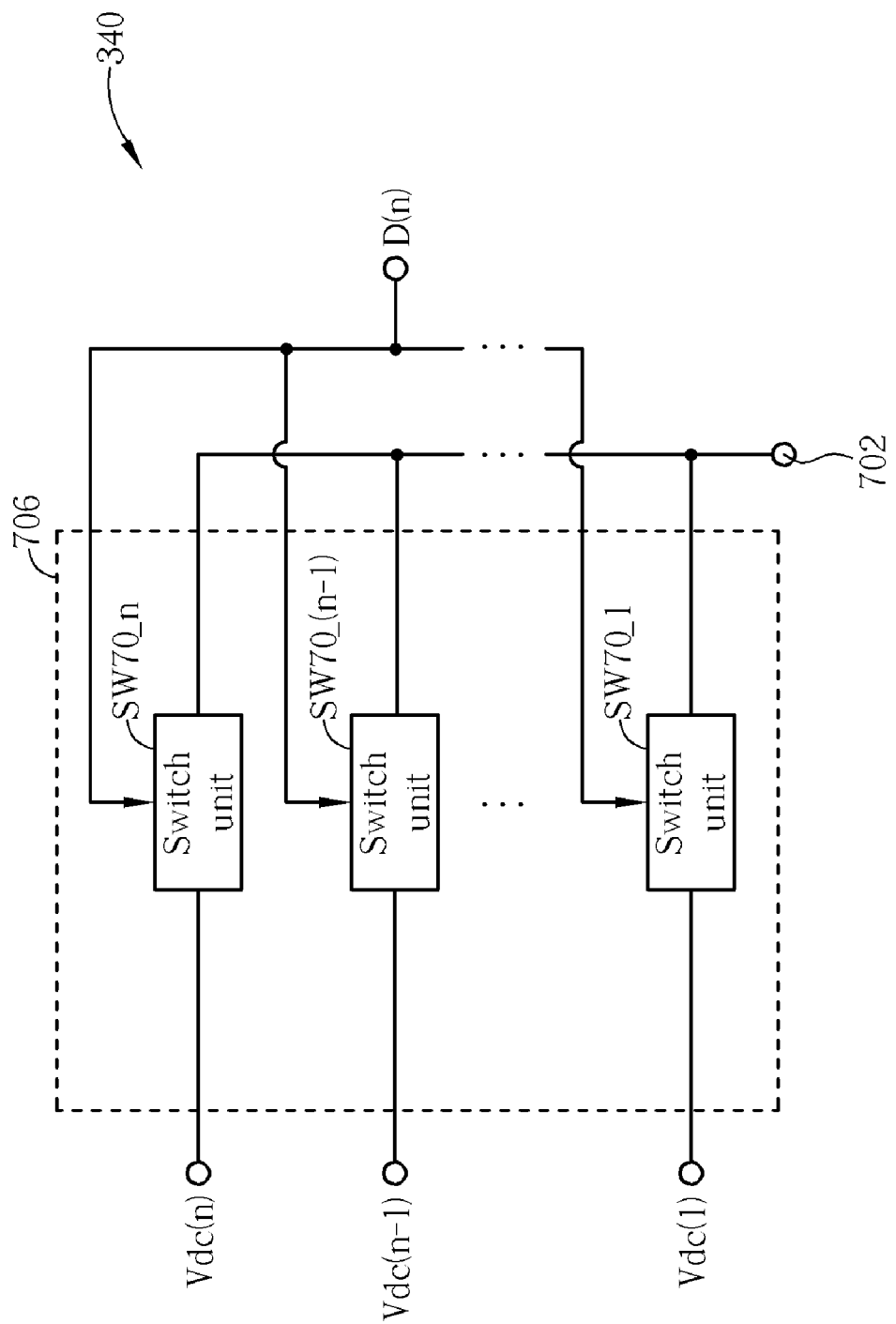
FIG. 7 is a schematic diagram of a first voltage selection module.
Figure 8:
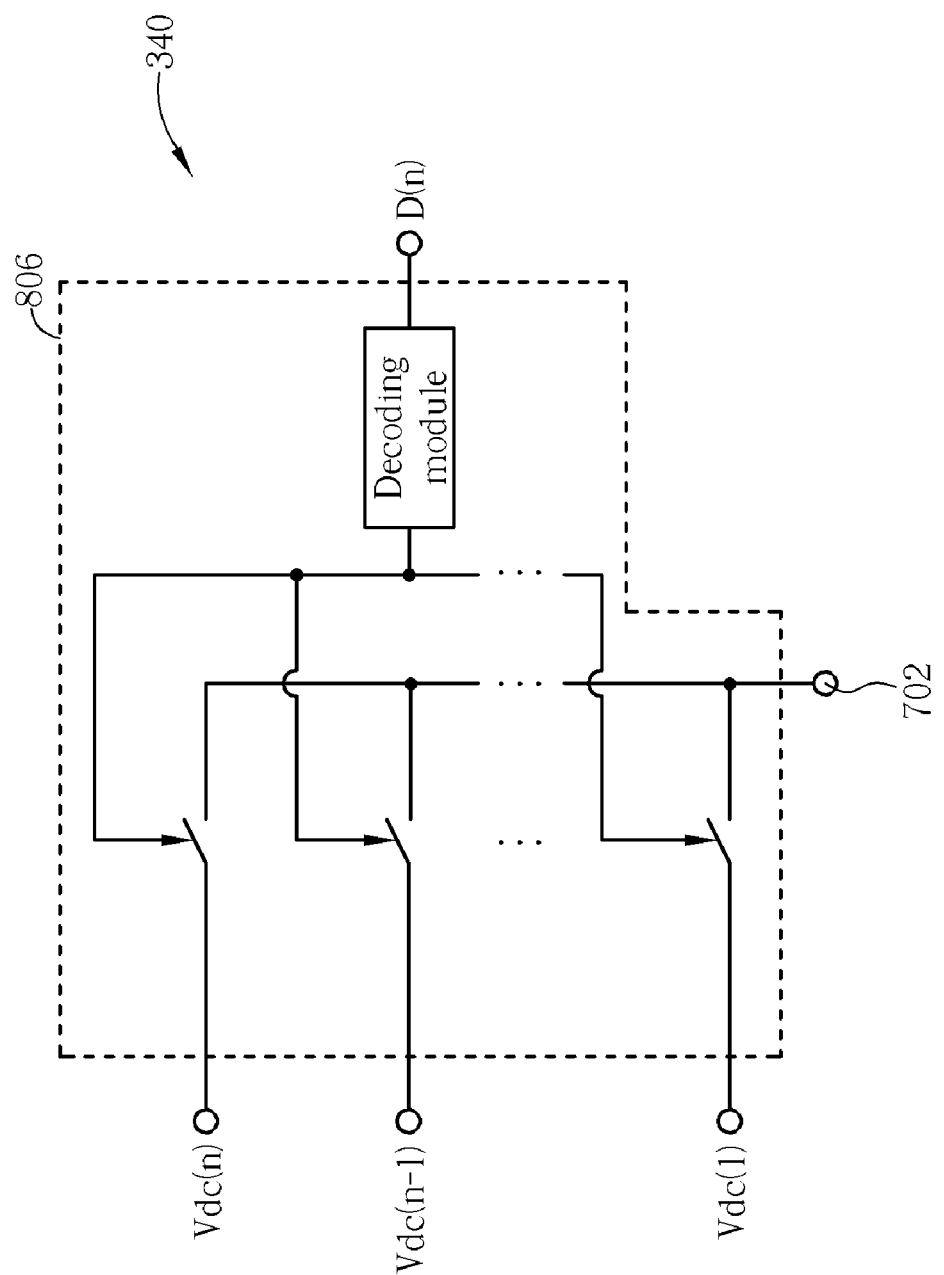
FIG. 8 is a schematic diagram of a first voltage selection module.

Please refer to FIG. 7, which is a schematic diagram of the first voltage selection module 340. The first voltage selection module 340 includes a signal end 702 and a switch module 706. The signal end 702 is coupled to the switch unit 384. The switch module 706 is used for conducting a connection between a DC voltage of DC voltages Vdc(1)~Vdc(n) and the signal end 702 through the switch units SW70_1~SW70_$n$ according to the digital signal D(n) outputted from the A/D converter 320. Certainly, as shown in FIG. 8, a switch module 806 can be applied to replace the switch module 706 for reducing production cost, and a concept thereof is similar to that of the resistance decision module 608 of FIG. 6, which will not be narrated in detail.

Figure 9:
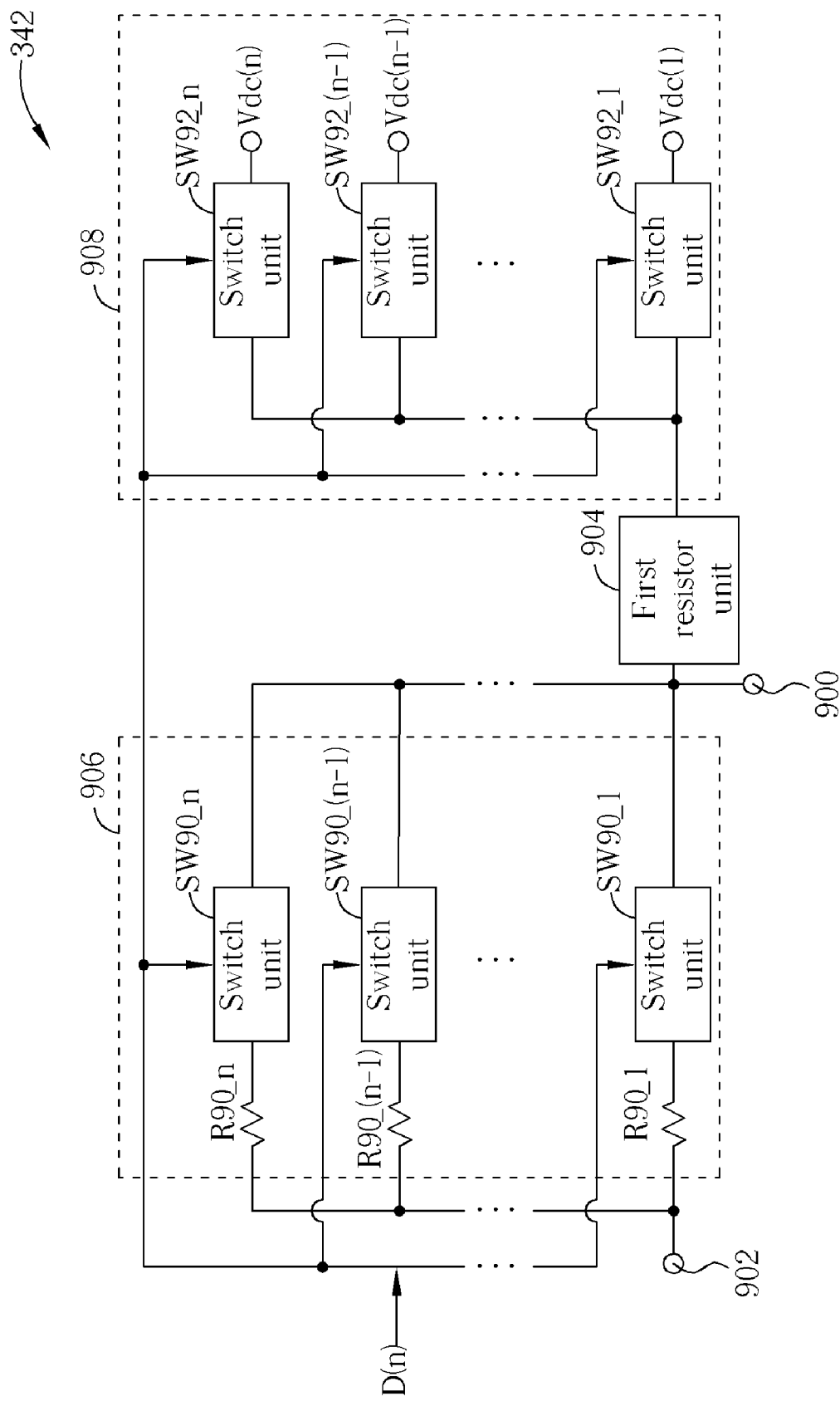
FIG. 9 is a schematic diagram of a second voltage selection module.
Figure 10:
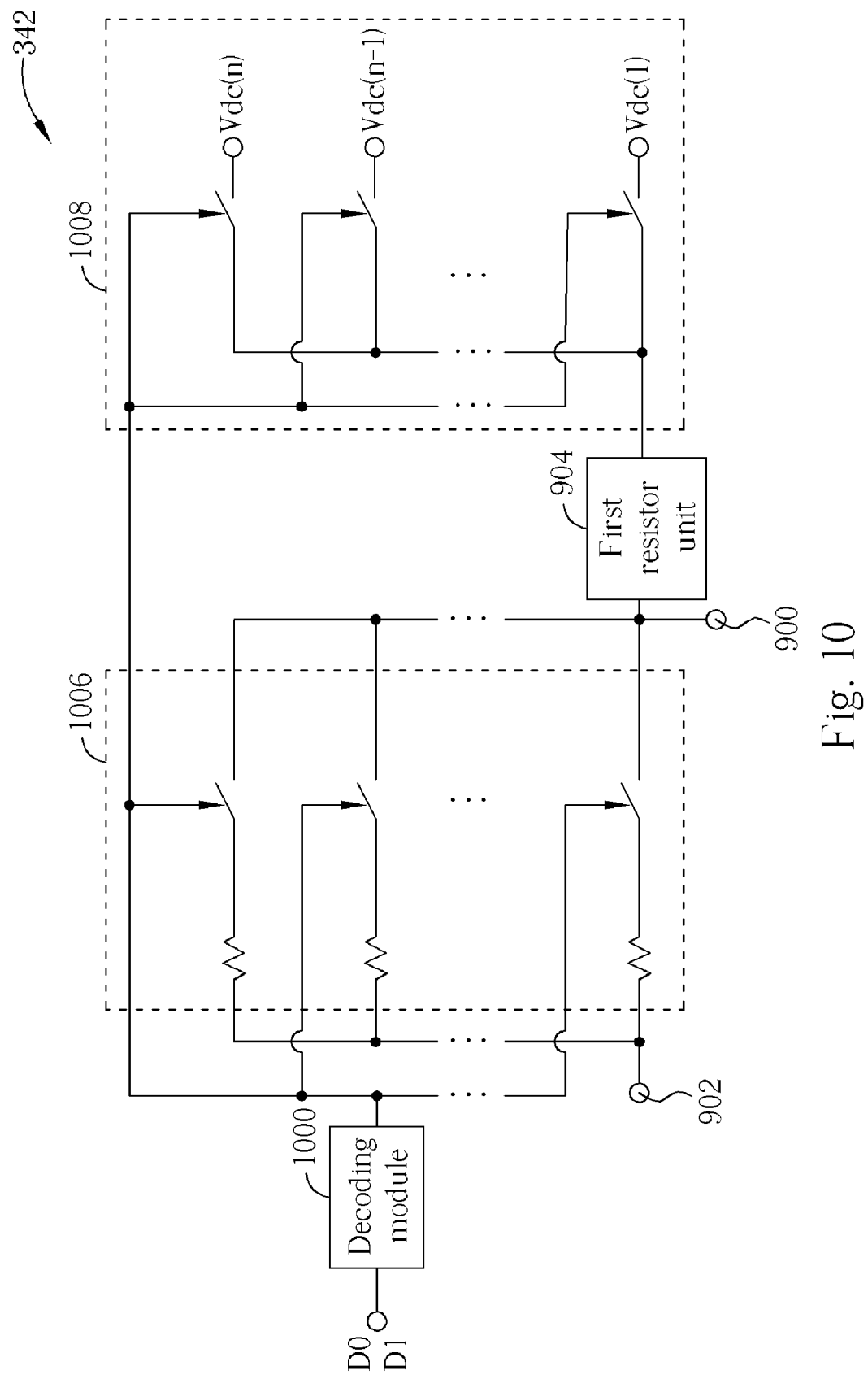
FIG. 10 is a schematic diagram of a second voltage selection module.

Please refer to FIG. 9, which is a schematic diagram of the second voltage selection module 342. The second voltage selection module 342 includes a first signal end 900, a second signal end 902, a first resistor unit 904, a resistance decision module 906, and a DC voltage selection module 908. The first signal end 900 is coupled to the switch unit 386, while the second signal end 902 is coupled to the analog voltage source. The first resistor unit 904 can be a resistor having a fixed resistance or variable resistance. The resistance decision module 906 determines resistance between the second signal end 902 and the first signal end 900 via resistors R90_1~R90_$n$ and switch units SW90_1~SW90_$n$ according to the digital signal D(n) outputted from the A/D converter 320, where all of the resistors R90_1~R90_$n$ are coupled to the second signal end 902. Each of the switch units SW90_1~SW90_$n$ conducts a connection between a resistor of the resistors R90_1~R90_$n$ and the first signal end 900 according to the digital signal D(n) outputted from the A/D converter 320. In addition, the DC voltage selection module 908 is used for conducting a connection between a DC voltage of the DC voltages Vdc(1)~Vdc(n) and the first resistor 904 through switch units SW92_1~SW92_$n$ according to the digital signal D(n) outputted from the A/D converter 320. Definitely, as shown in FIG. 10, a resistance decision module 1006, a DC voltage selection module 1008, and a decoding module 1000 can be employed to replace the resistance decision module 906 and the DC voltage selection module 908 for reducing production cost, and concepts thereof are similar to that of the resistance decision module 608, which will not be narrated in detail.

Figure 11:
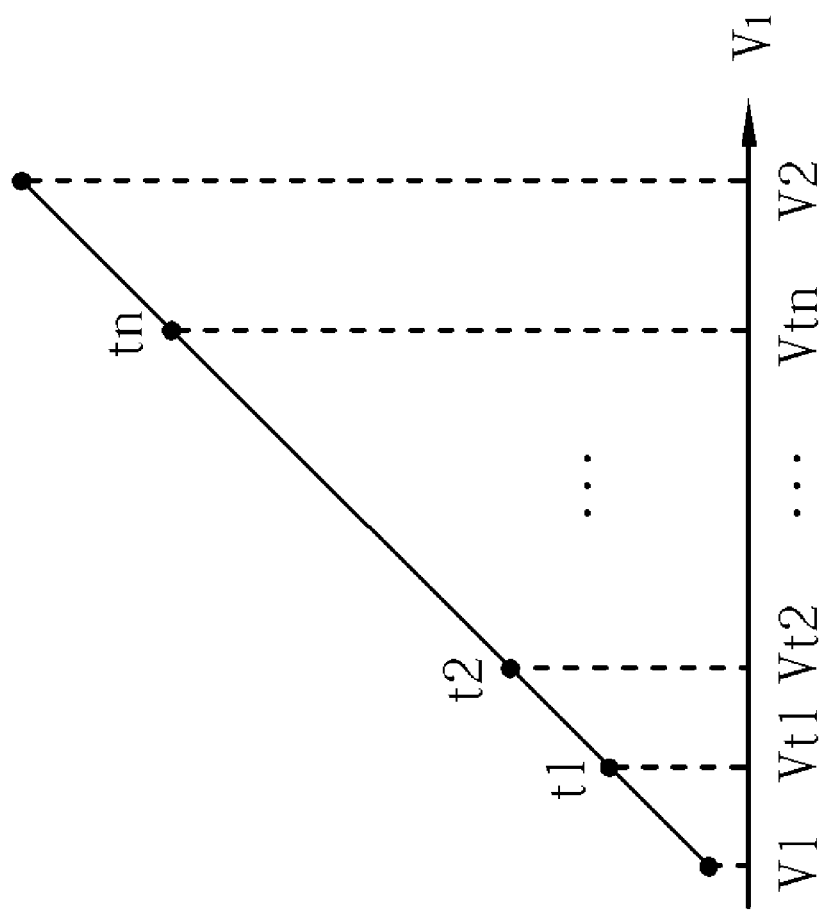
FIG. 11 is a schematic diagram of an analog voltage provided by an analog voltage source.
Figure 12:
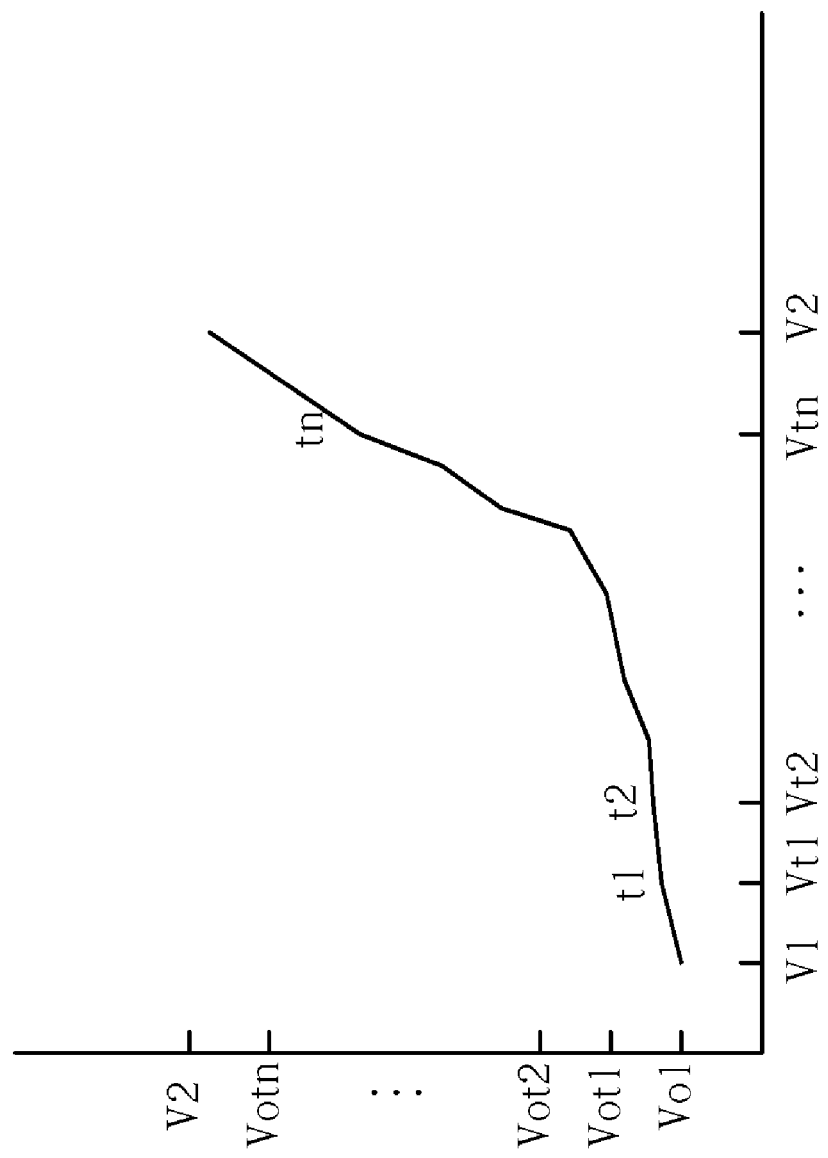
FIG. 12 is a schematic diagram of an output voltage of the voltage output module according to FIG. 3 versus the analog voltage according to FIG. 11.
Figure 13:
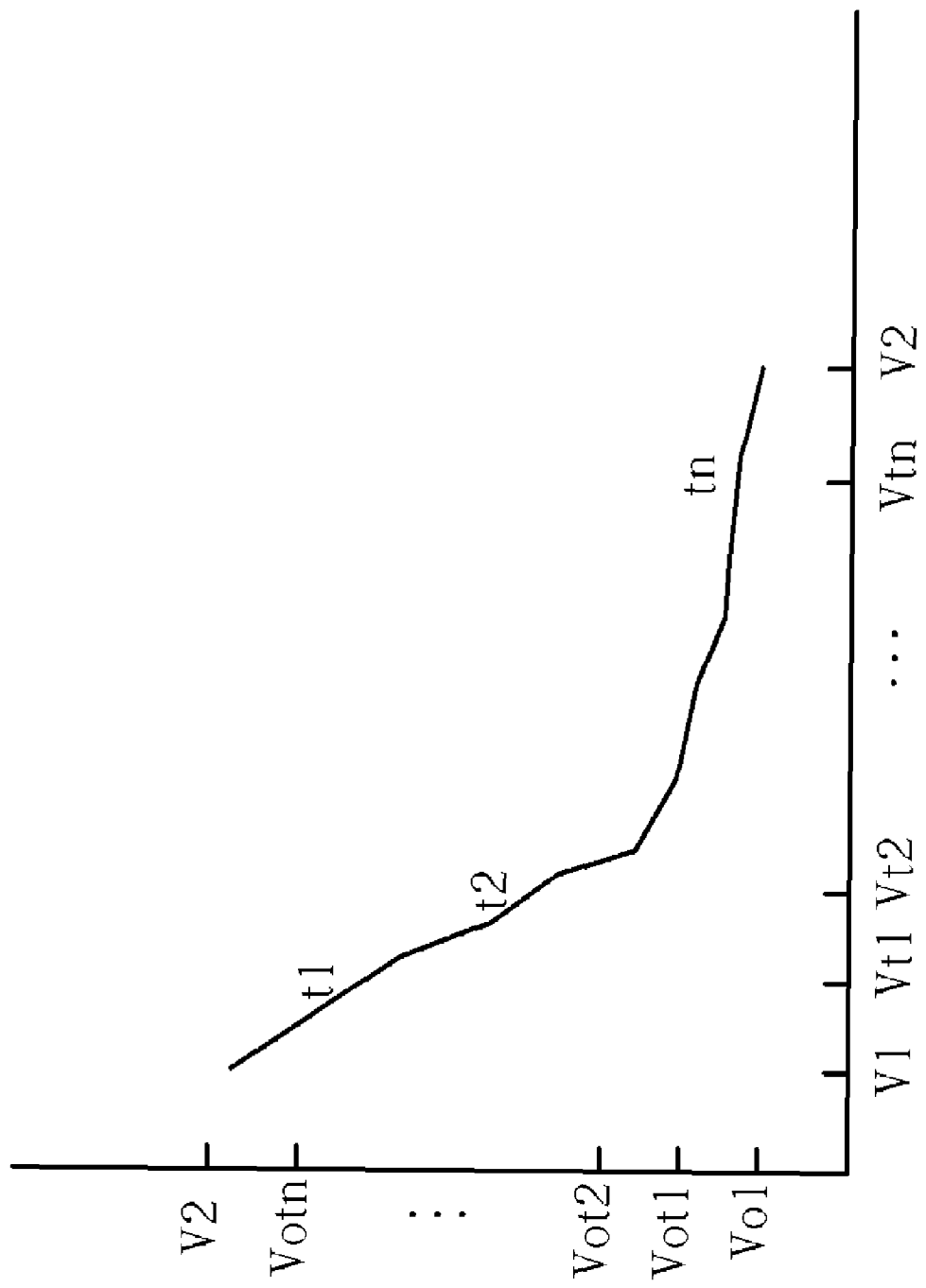
FIG. 13 is a schematic diagram of an output voltage of the voltage output module according to FIG. 3 versus the analog voltage according to FIG. 11.

Therefore, in the voltage conversion device 30, the voltage output module 36 amplifies voltage received by the second input end 362 of the voltage output module 36 in a negative-feedback manner according to the gain determined by the gain selector 322. Via the voltage conversion device 30 of the present invention, those skills in the art can appropriately determine reference voltages Vr(1)~Vr(n), Vdc(1)~Vdc(n), and resistance of resistors R50_1~R50_$n$, R50$a$_1~R50$a$_$n$, R70_1~R70_$n$, R90_1~R90_$n$ according to expected voltage turning points, which will be described later, so as to control the switches SW50_1~SW50_$n$, SW70_1~SW70_$n$, SW90_1~SW90_$n$, and SW92_1~SW92_$n$ via the digital signal D(n) outputted from the A/D converter 320 for determining a required voltage gain and a corresponding dc shift voltage. For example, please refer to FIGS. 11, 12 and 13. FIG. 11 is a schematic diagram of the analog voltage Vi of the analog voltage source. FIG. 12 is a schematic diagram of the output voltage Vo of the voltage output module 36 versus the analog voltage Vi when an inverse signal POLB corresponding to the polarity selection signal POL is enabled, while FIG. 13 is a schematic diagram of the output voltage Vo of the voltage output module 36 versus the analog voltage Vi when the polarity selection signal POL is enabled. As known from FIG. 11 to FIG. 13, a voltage range of the analog voltage Vi is between V1 and V2. Besides, if the expected voltage turning points t1, t2 . . . tn are corresponding to voltages Vt1, Vt2 . . . Vtn, corresponding gain curves of the output voltage Vo versus the input voltage Vi can be achieved by adjusting related values of corresponding elements, as shown in FIGS. 12 and 13. That is to say, the voltage conversion device 30 has non-linear gain with positive and negative polarities.

In general, the gain of the prior-art voltage conversion circuit is expected to be as linear as possible. However, some specific applications require non-linear gain. For example, as to data-line signals of an LCD monitor, an ideal grayscale curve should relatively fit in with the brightness identification ability of human eyes. Through the present invention, the voltage conversion device 30 can provide various gains in accordance with different input voltages to allow the data-line-signal output circuit of the LCD monitor performing a grayscale curve appropriate to the human eyes. The grayscale curve performed by the LCD monitor relatively fits in with the brightness identification ability of human eyes, so that images displayed can become natural. In addition, via the polarity selection signal POL, the present invention utilizes the voltage conversion device 30 to output voltages with alternate positive and negative polarities. Therefore, the voltage conversion device 30 can function to convert display data of an LCD monitor for making the grayscale curve performed by the LCD monitor relatively fit in with the brightness identification ability of human eyes. Moreover, liquid crystals of the LCD monitor are driven by means of alternating between positive-polarity and negative-polarity voltages, which can increase image quality and prevent from the residual image effect and breakage of the liquid crystals.

Figure 14:
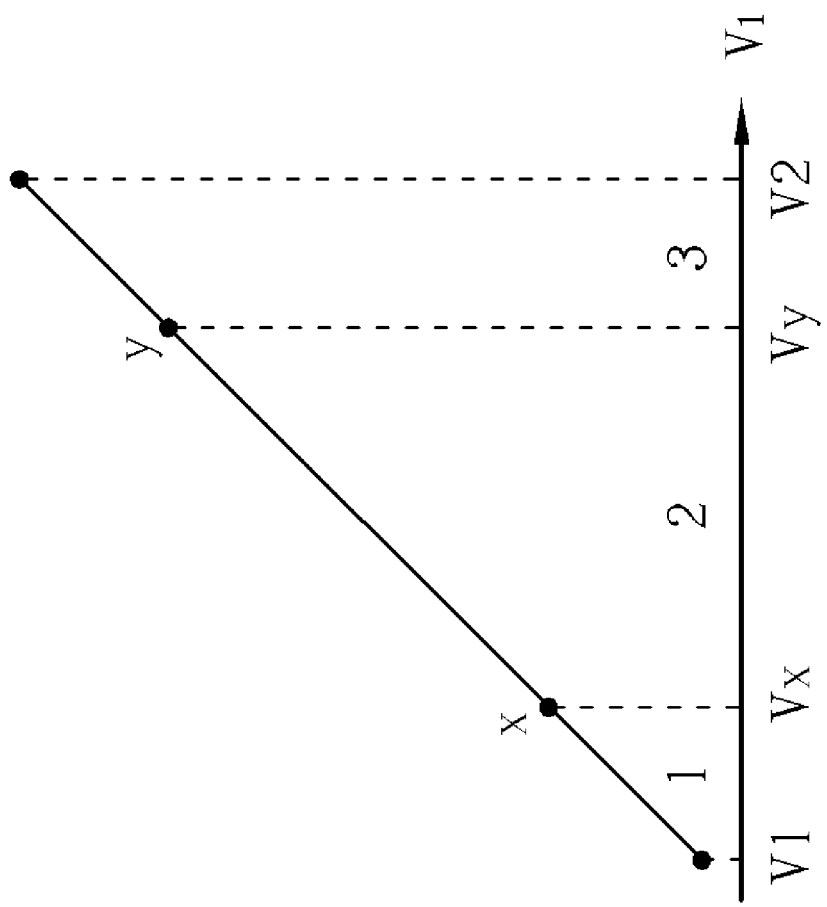
FIG. 14 is a schematic diagram of an analog voltage provided by an analog voltage source.
Figure 15:
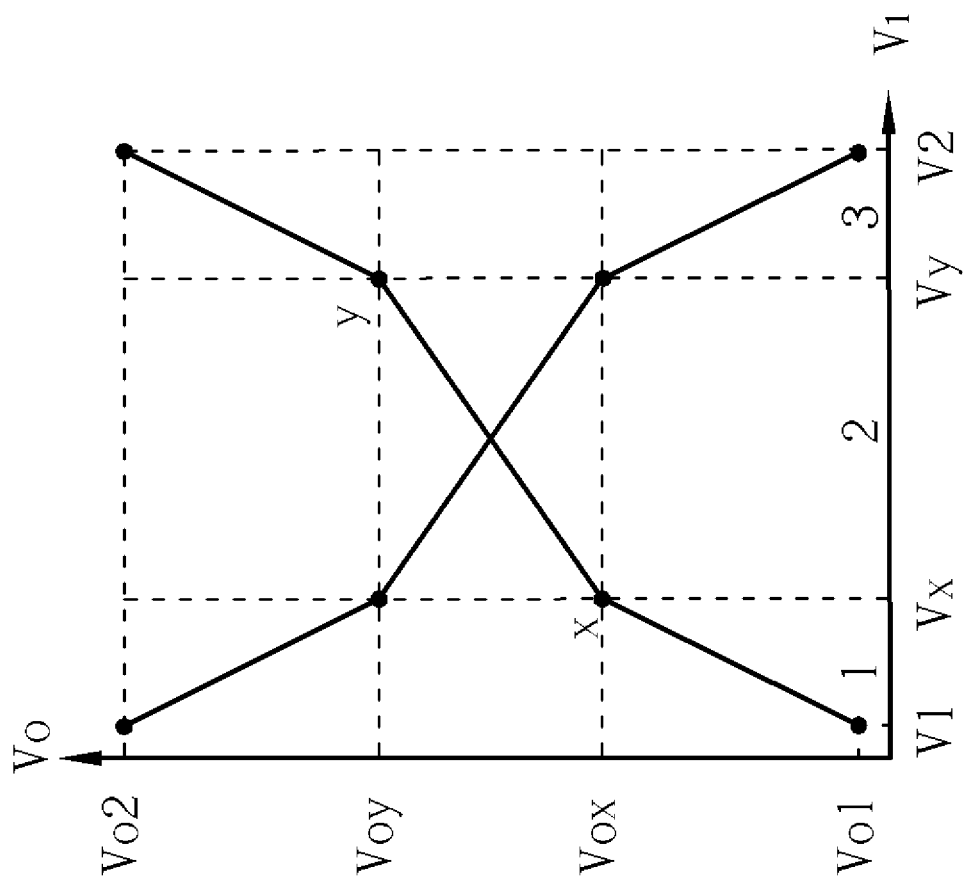
FIG. 15 is a schematic diagram of an expected output voltage versus an analog voltage.

Adjusting corresponding values and quantities of elements in the voltage conversion device 30 can obtain the required gain curve. For example, please refer to FIGS. 14 and 15. FIG. 14 is a schematic diagram of the analog voltage Vi of the analog voltage source, while FIG. 15 is a schematic diagram of the required/expected output voltage Vo versus the analog voltage Vi. As known from FIGS. 14 and 15, a voltage range of the analog voltage Vi is between V1 and V2, and turning points x, y are corresponding to voltages Vx, Vy. If output voltages corresponding to the voltages Vx, Vy are Vox, Voy, a gain curve of the output voltage Vo versus the analog voltage Vi can be achieved as shown in FIG. 15 by adjusting values and quantities of related elements.

Figure 16:
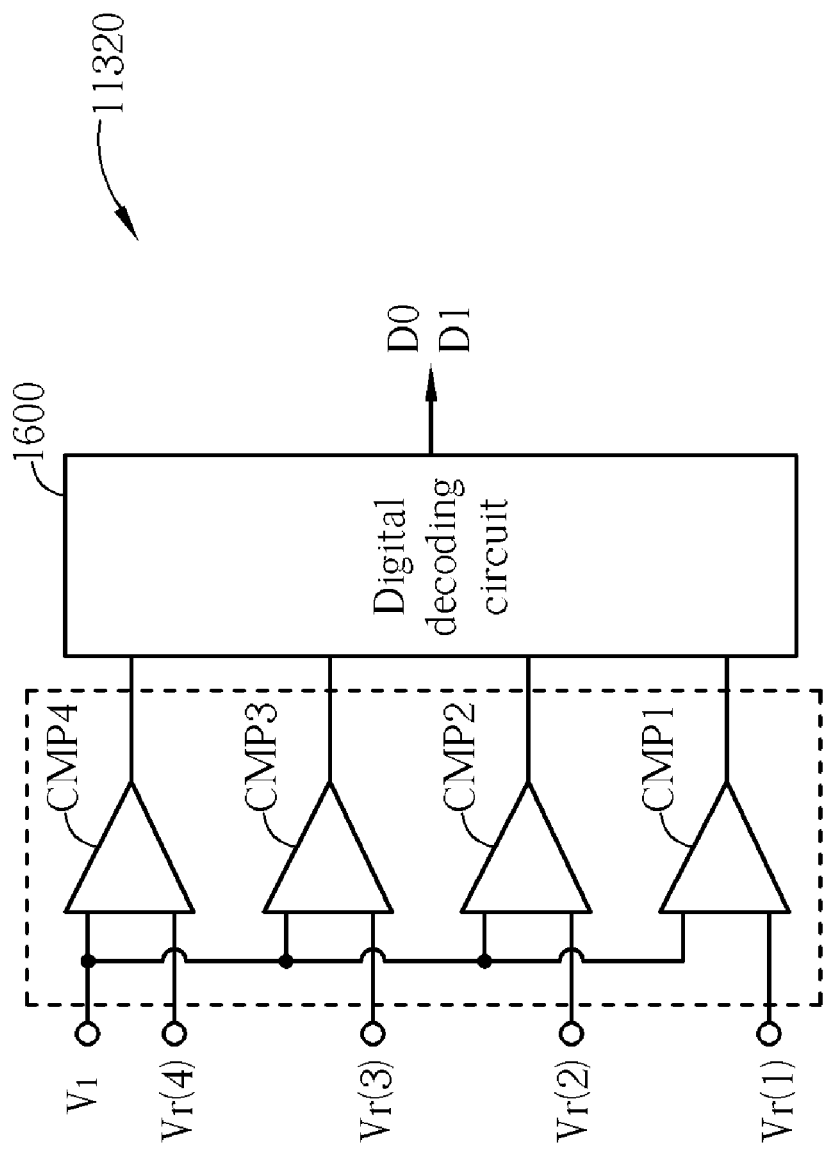
FIG. 16 is a schematic diagram of an A/D converter.

Please refer to FIG. 16, which is a schematic diagram of an A/D converter 11320. The A/D converter 11320 is employed to replace the A/D converter 320 of FIG. 3 for achieving the gain curve shown in FIG. 15. The A/D converter 11320 includes comparators CMP1~CMP4 and a digital decoding circuit 1600. The digital decoding circuit 1600 outputs digital signals D0, D1 according to a comparison result outputted from the comparators CMP1~CMP4.

Figure 17:
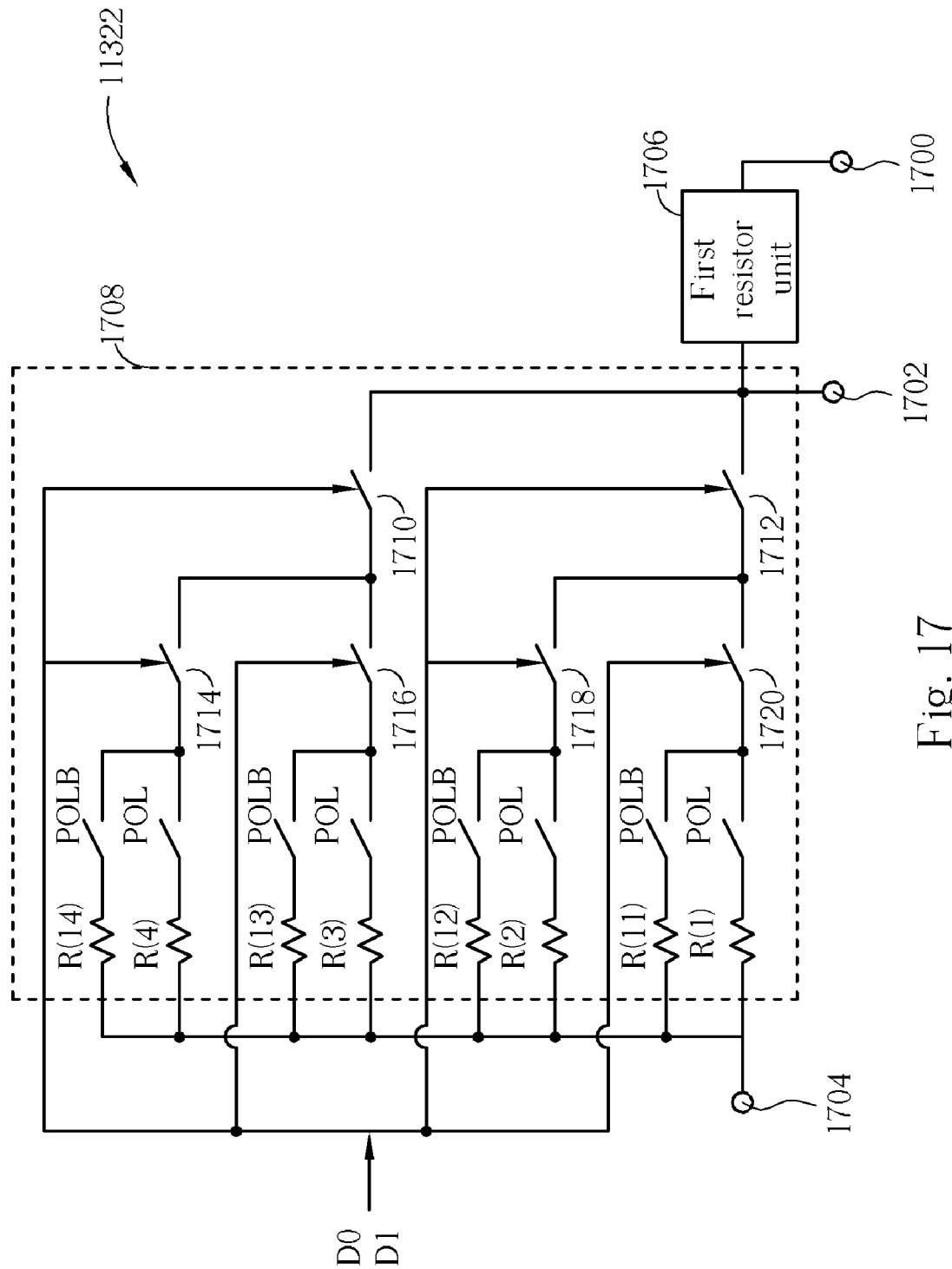
FIG. 17 is a schematic diagram of a gain selector.
Figure 19:
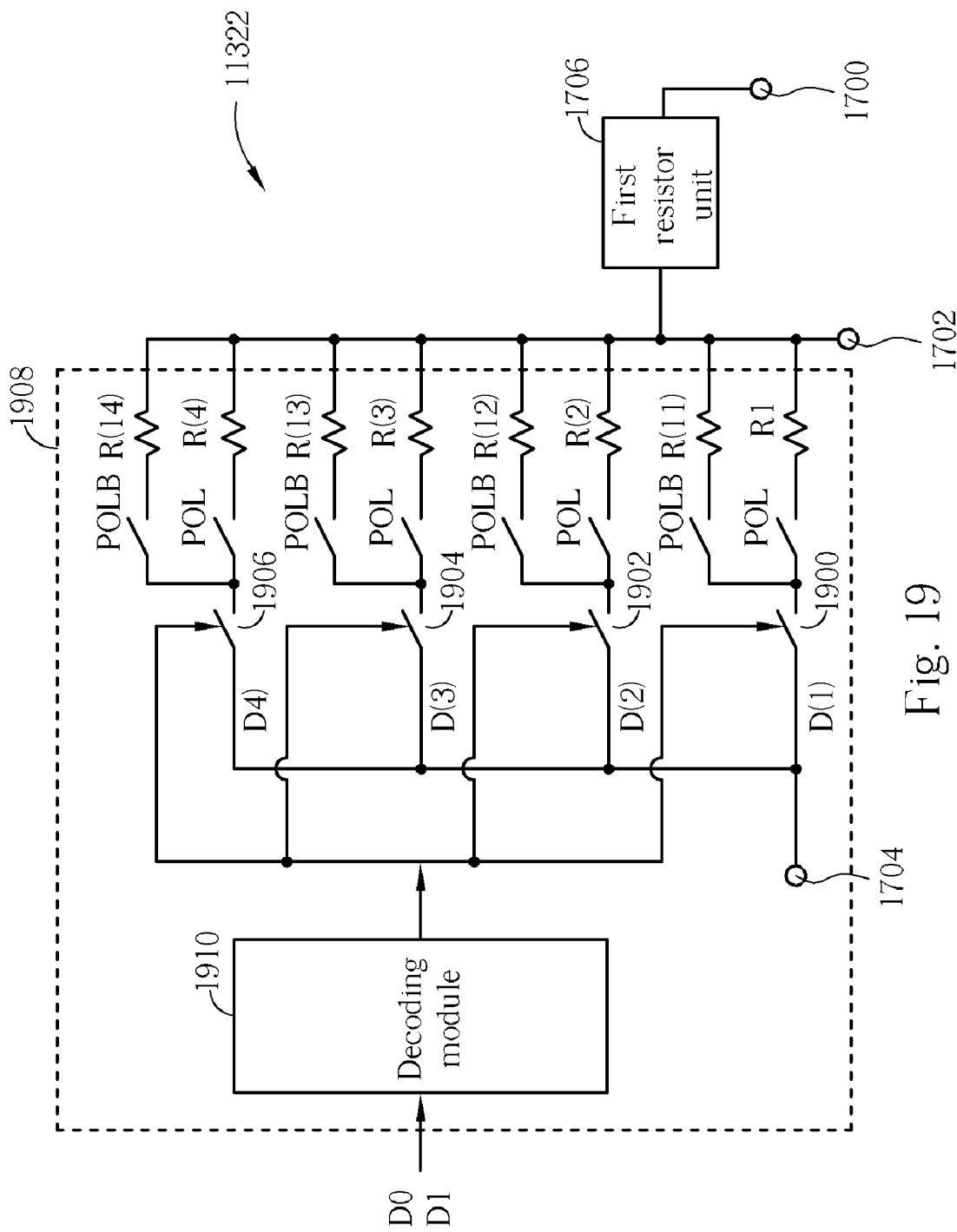
FIG. 19 is a schematic diagram of a gain selector.

Please refer to FIG. 17, which is a schematic diagram of the gain selector 11322. The gain selector 11322 is employed to replace the gain selector 322 of FIG. 3 for achieving the gain curve shown in FIG. 15. The gain selector 11322 includes a first signal end 1700, a second signal end 1702, a third signal end 1704, a first resistor unit 1706, and a resistance decision module 1708, and an operating principle thereof is similar to that of the gain selector 322, which will not narrated in detail. For achieving the gain curve shown in FIG. 15, the resistance decision module 1708 includes resistors R(1)~R(4) and switches 1710, 1712, 1714, 1716, 1718, and 1720. The switch 1710 is driven by the digital signal D1. The switch 1712 is driven by an inverse signal corresponding to the digital signal D1. The switches 1714 and 1718 are driven by the digital signal D0. The switches 1716, 1720 are driven by an inverse signal corresponding to the digital signal D0. As a result, an operating principle of the resistance decision module 1708 can be represented by a truth table shown in FIG. 18. In addition, please refer to FIG. 19. According to the resistance decision module 608 of FIG. 6, a resistance decision module 1908 can be employed to replace the resistance decision module 1708. The resistance decision module 1908 includes resistors R(1)~R(4), switches 1900, 1902, 1904, 1906, and a decoding module 1910. The decoding module 1910 decodes the digital signals D0 and D1 into the digital signals D(1), D(2), D(3), and D(4) for separately controlling the switches 1900, 1902, 1904, and 1906. Under this circumstance, an operating principle of the resistance decision module 1908 can be represented by a truth table shown in FIG. 20.

Figure 21:
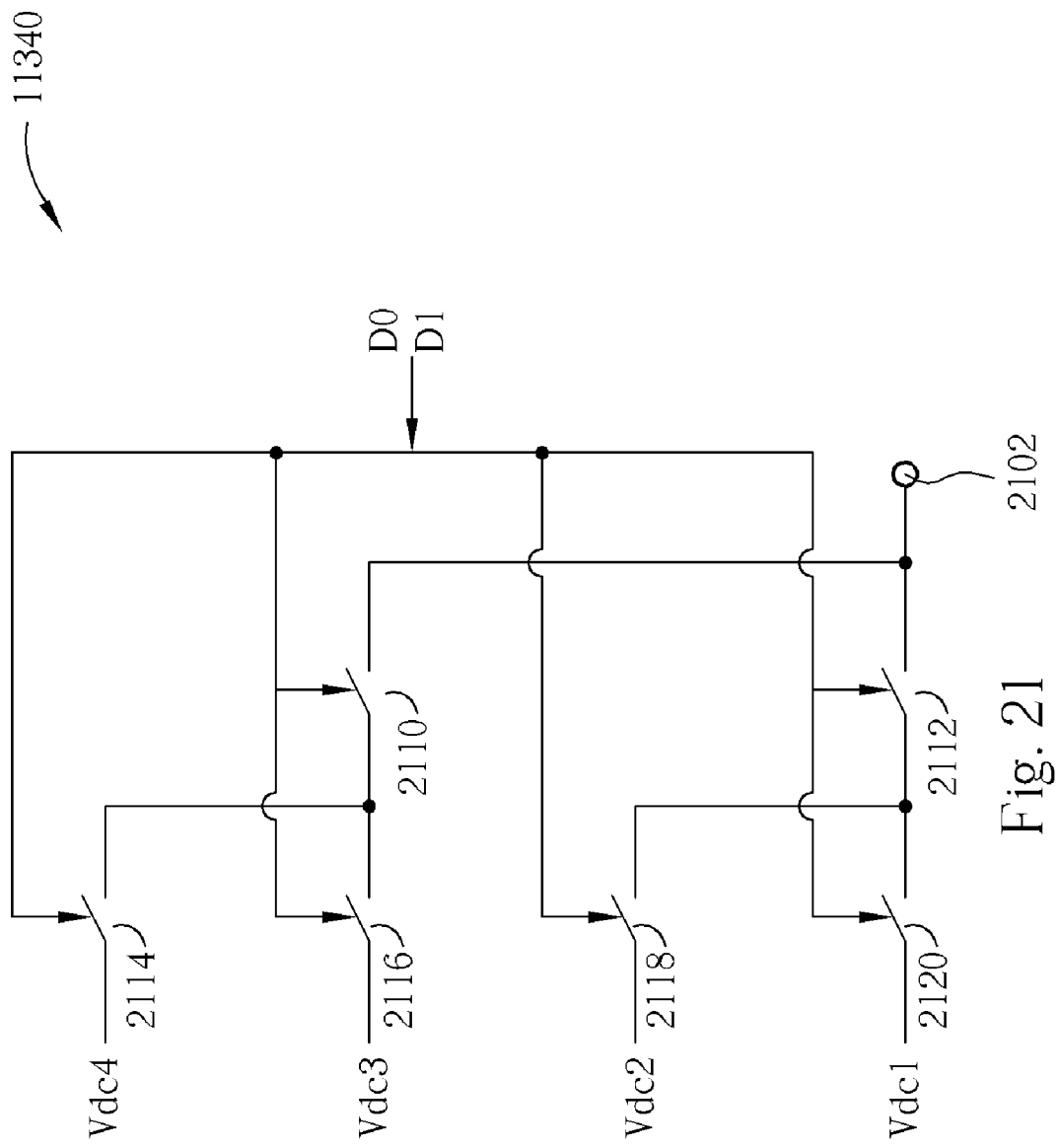
FIG. 21 is a schematic diagram of a first voltage selection module.
Figure 22:
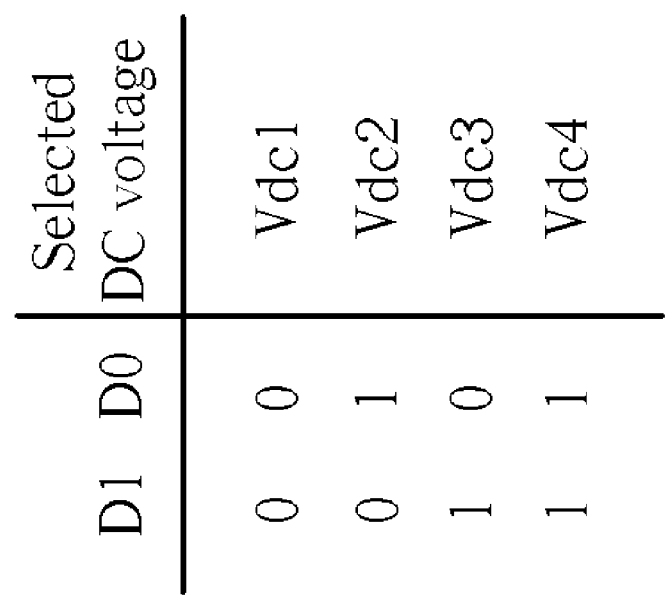
FIG. 22 is a truth table of the first voltage selection module according to FIG. 21.
Figure 23:
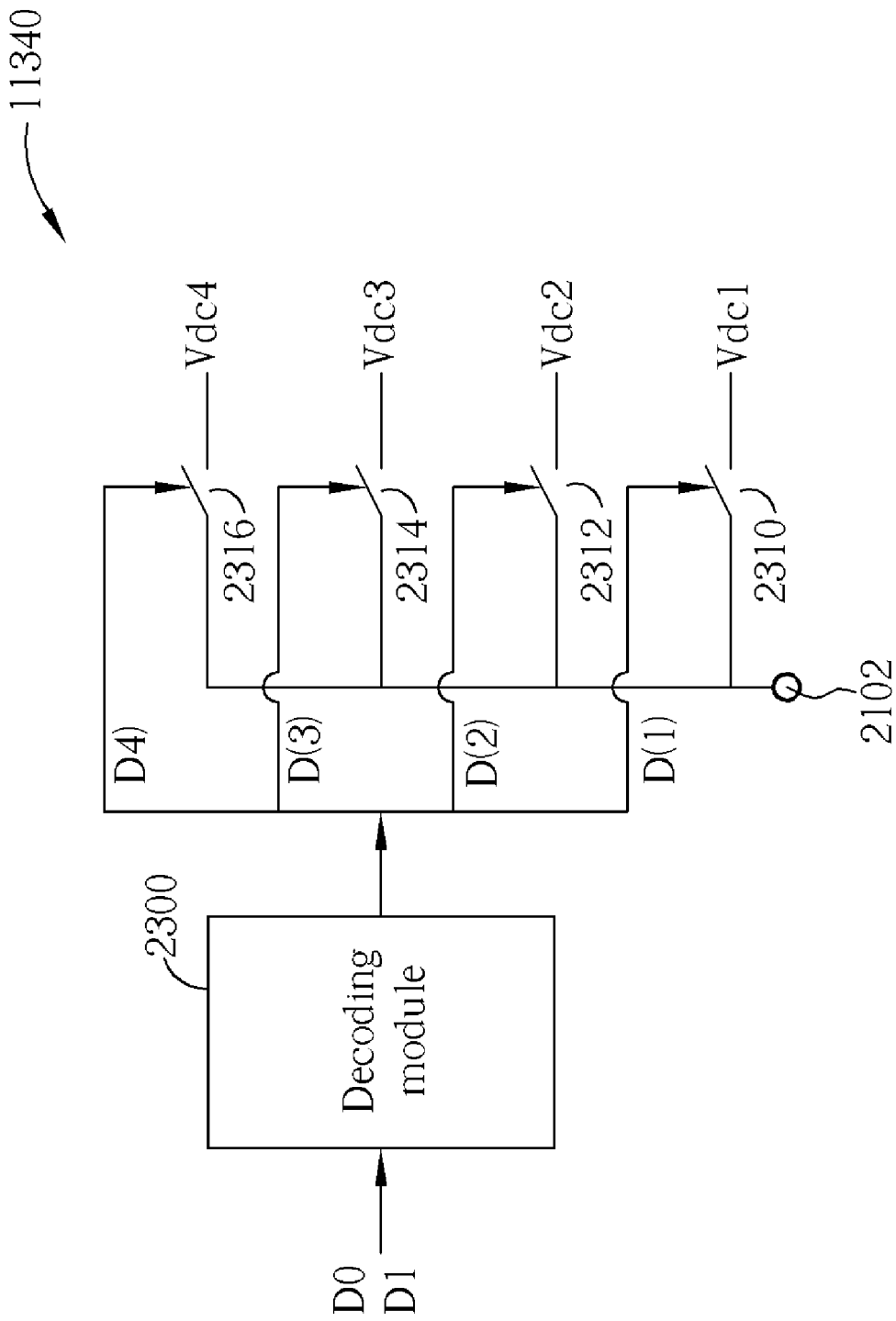
FIG. 23 is a schematic diagram of a first voltage selection module.
Figure 24:
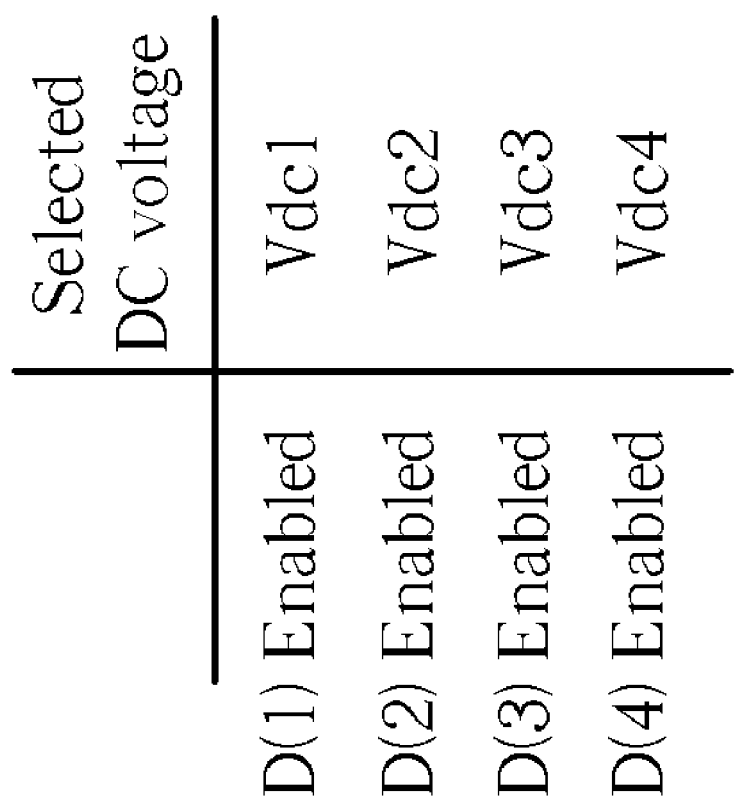
FIG. 24 is a truth table of the first voltage selection module according to FIG. 23.

Please refer to FIG. 21, which is a schematic diagram of the first voltage selection module 11340. The first voltage selection module 11340 is employed to replace the first voltage selection module 340 of FIG. 3 for achieving the gain curve shown in FIG. 15. The first voltage selection module 11340 includes a signal end 2102 and switches 2110, 2112, 2114, 2116, 2118, 2120, and an operating principle thereof is similar to that of the first voltage selection module 340 shown in FIG. 7, which will not be narrated in detail. The switch 2110 is driven by the digital signal D1. The switch 2112 is driven by an inverse signal corresponding to the digital signal D1. The switches 2114 and 2118 are driven by the digital signal D0. The switches 2116 and 2120 are driven by the inverse signal corresponding to the digital signal D0. Thereby, an operating principle of the first voltage selection module 11340 can be represented by a truth table shown in FIG. 22. Besides, according to the concept of FIG. 8, a decoding module 2300 and switches 2310, 2312, 2314, 2316 can be employed to replace the switches 2110, 2112, 2114, 2116, 2118, 2120, as shown in FIG. 23, and a truth table thereof is shown in FIG. 24.

Figure 25:
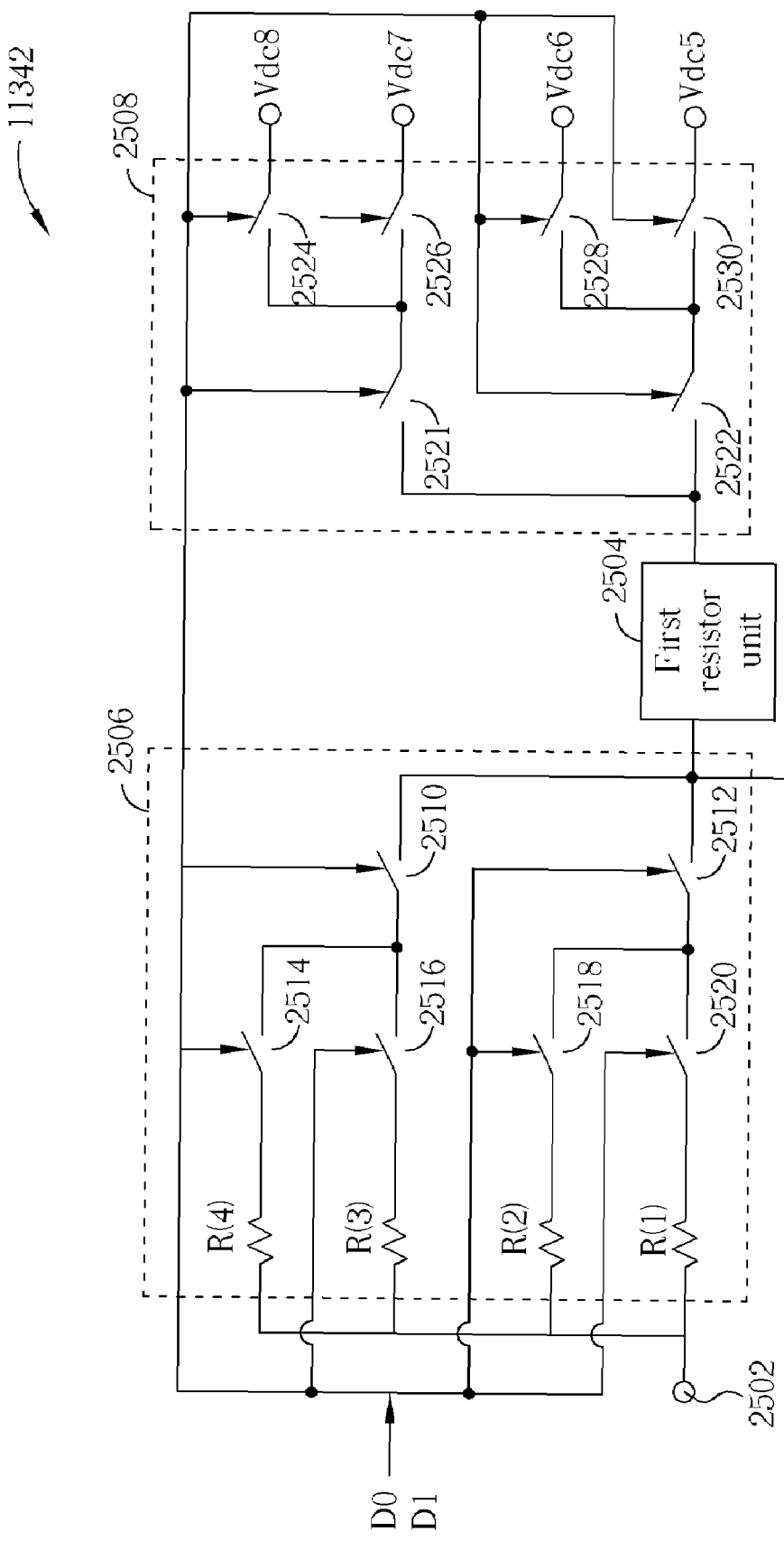
FIG. 25 is a schematic diagram of a second voltage selection module.
Figure 27:
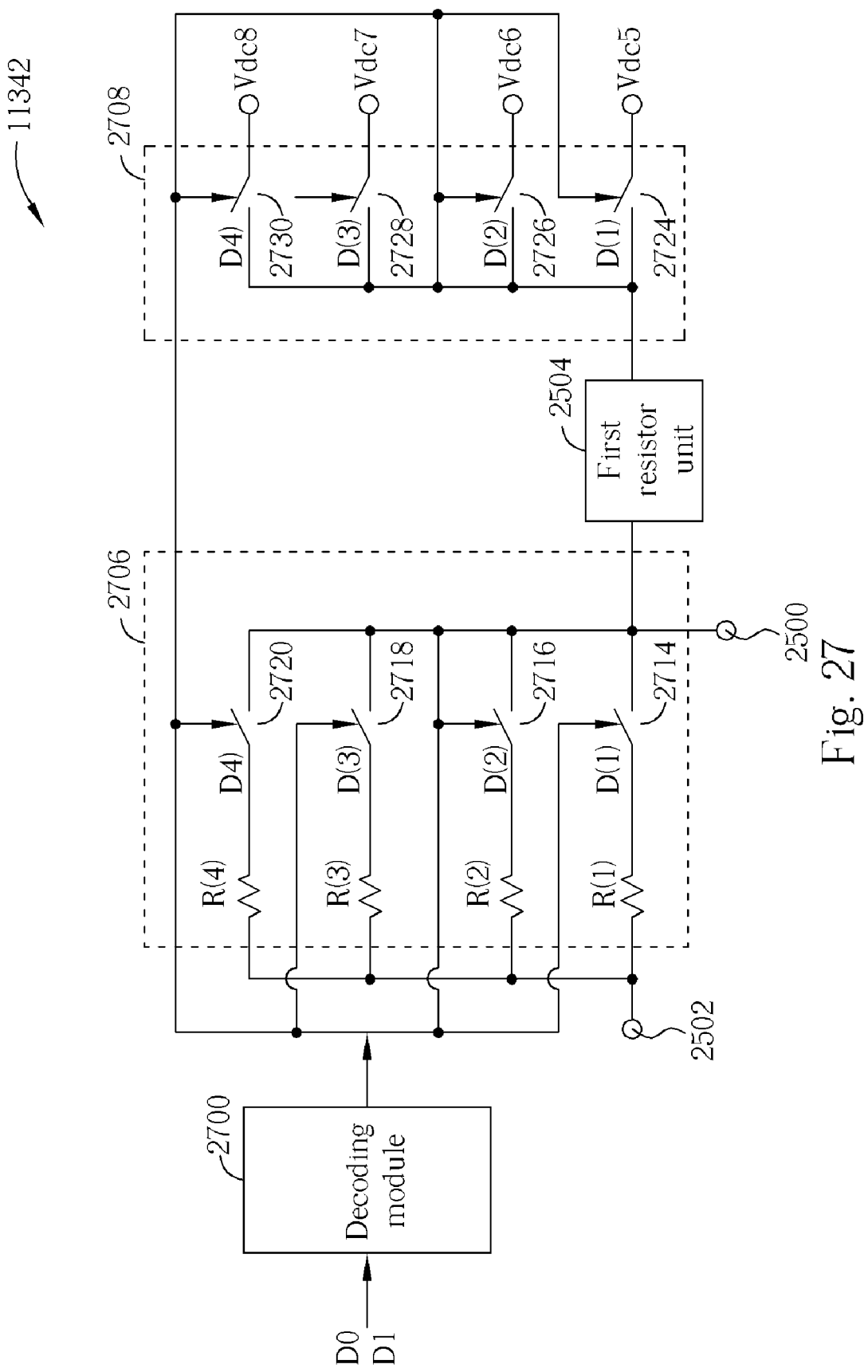
FIG. 27 is a schematic diagram of a second voltage selection module.

Please refer to FIG. 25, which is a schematic diagram of the second voltage selection module 11342. The second voltage selection module 11342 is employed to replace the second voltage selection module 342 of FIG. 3 for achieving the gain curve shown in FIG. 15. The second voltage selection module 11342 includes a first signal end 2500, a second signal end 2502, a first resistor unit 2504, a resistance decision module 2506, and a DC voltage selection module 2508, and an operating principle thereof is similar to that of the second voltage selection module 342 in FIG. 9, which will not be narrated in detail. Thus, for achieving the gain curve shown in FIG. 15, the resistance decision module 2506 includes resistors R(1)~R(4) and switches 2510, 2512, 2514, 2516, 2518, 2520. The switch 2510 is driven by the digital signal D1. The switch 2512 is driven by the inverse signal corresponding to the digital signal D1. The switches 2514 and 2518 are driven by the digital signal D0. The switches 2516 and 2520 are driven by the inverse signal corresponding to the digital signal D0. The DC voltage selection module 2508 includes switches 2521, 2522, 2524, 2526, 2528, and 2530. The switch 2521 is driven by the digital signal D1. The switch 2522 is driven by the inverse signal corresponding to the digital signal D1. The switches 2524 and 2528 are driven by the digital signal D0. The switches 2526 and 2530 are driven by the inverse signal corresponding to the digital signal D0. Therefore, under this circumstance, an operating principle of the second voltage selection module 11342 can be represented by a truth table shown in FIG. 26. Furthermore, according to the concept of FIG. 10, a decoding module 2700, a resistance decision module 2706, and a DC voltage selection module 2708 are employed to replace the resistance decision module 2506 and the DC voltage selection module 2508, as shown in FIG. 27. The decoding module 2700 decodes the digital signals D0 and D1 into the digital signals D(1), D(2), D(3), and D(4) for controlling the switches 2714, 2716, 2718, 2720 of the resistance decision module 2706 and the switches 2724, 2726, 2728, 2730 of the DC voltage selection module 2708, and a truth table thereof is shown in FIG. 28.

Therefore, converting display data of an LCD monitor with the voltage conversion device 30, the LCD monitor can perform a grayscale curve fit in with the brightness identification ability of human eyes, so as to increase color gradient effect of images, which makes the images more natural to the sense of sight. Moreover, by controlling the polarity selection signal POL and the inverse signal POLB thereof, the voltage conversion device 30 can switch polarity of the output signal to prevent the LCD monitor from continuously using positive or negative polarity voltage to drive liquid crystals of the LCD monitor, which decreases image quality, such that the residual image effect and breakage of the liquid crystals can be avoided.

Figure 29:
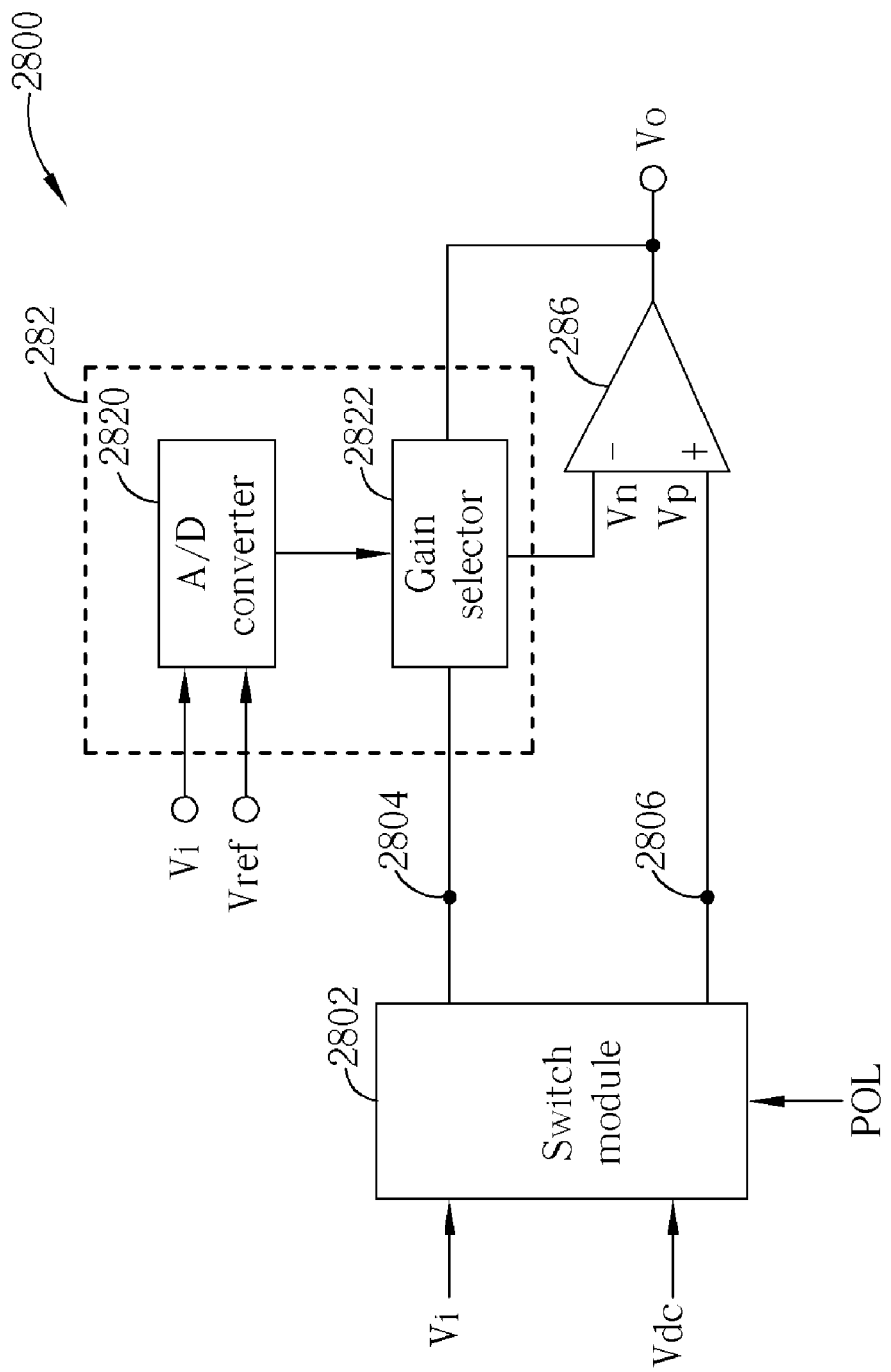
FIG. 29 is a schematic diagram of a voltage conversion device according to an embodiment of the present invention.

Please refer to FIG. 29, which is a schematic diagram of the voltage conversion device 2800 according to an embodiment of the present invention. The voltage conversion device 2800 is used for converting an analog voltage Vi provided by an analog voltage source, where the analog voltage source can be display data of a flat panel display. The voltage conversion device 2800 includes a gain decision module 282, a voltage output module 286, and a switch module 2802. The gain decision module 282 includes an analog-to-digital (A/D) converter 2820 and a gain selector 2822, and architecture thereof is the same as that of the gain decision module 32 (please referred in the foregoing description), but different in coupling relations. In the voltage conversion device 30, the gain decision module 32 is coupled to an end of the switch units 380 and 382, whereas in the voltage conversion device 2800, the gain decision module 282 is coupled to switch module 2802. The switch module 2802 includes output ends 2804, 2806 and is used for determining to output the analog voltage Vi by the output end 2804 and output a direct-current (DC) voltage Vdc of a DC voltage source by the output end 2806, or output the DC voltage Vdc by the output end 2804 and output the analog voltage Vi by the output end 2806 according to a polarity selection signal POL. Furthermore, the gain decision module 282 is used for determining a gain outputted by the voltage output module 286, while the switch module 2802 is used for determining polarity of an output voltage.

Therefore, via the voltage conversion device 2800, when the polarity selection signal POL is enabled, the switch module 2802 conducts the analog voltage Vi to the output end 2804 and the DC voltage Vdc to the output end 2806. On the contrary, when an inverse signal POLB corresponding to the polarity selection signal POL is enabled, the switch module 2802 conducts the analog voltage Vi to output end 2806 and the DC voltage Vdc to the output end 2804. Under this circumstance, a curve of an output voltage Vo of the voltage conversion device 2800 versus the analog voltage Vi is developed as shown in FIG. 15. Therein, voltage level of the DC voltage Vdc is generated based on a required grayscale curve. Otherwise, the DC voltage Vdc is provided through the first voltage selection modules 340, 11340 or the second voltage selection modules 342, 11342 according to the corresponding analog voltage Vi. For example, assumed that the DC voltage Vdc is provided through the first voltage selection modules 11340 and the second voltage selection module 11342, and moreover, characteristics of the expected gain curve shown in FIG. 15 are: V1=0.1V, Vx=0.2V, Vy=0.9V, V2=1V, Vo1=0.1V, Vox=1V, Voy=4V, Vo2=4.9V. Under this circumstance, when the polarity selection signal POL is enabled, the first signal end 1700 of the resistance decision module 11322 in FIG. 17 is coupled to the output end 364 of the voltage output module 36, and the second signal end 1702 is coupled to the first input end 360 of the voltage output module 36. Moreover, the third signal end 1704 is coupled to an end of the switch units 380, 382. Set R(1)=(resistance of the first resistor unit 1706/9)(Ω), R(2)=[(resistance of the first resistor unit 1706*0.7)/3](Ω), and R(3)=(resistance of the first resistor unit 1706/9)(Ω). Furthermore, in the first voltage selection module 11340 of FIG. 21, set Vdc1=(5.8/10)V, Vdc2=(3.4/3.7)V, Vdc3=(9.1/10)V. On the contrary, when the inverse signal POLB corresponding to the polarity selection signal POL is enabled, in the resistance decision module 11322 of FIG. 17, set R(11)=(resistance of the first resistor unit 1706/17)(Ω), R(12)=[(resistance of the first resistor unit 1706*7)/53](Ω), and R(13)=(resistance of the first resistor unit 1706/7)(Ω). Furthermore, in the second voltage selection module 11342 of FIG. 25, set Vdc5=(−0.8/9)V, Vdc6=(0.1/3)V, Vdc7=(−4.1/9)V, R(1)=R(2)=R(3)=(resistance of the first resistor unit 2504)(Ω).

In conclusion, the present invention can adjust an output gain by controlling corresponding values of elements of the voltage conversion device, so that the present invention can obtain various gains with different input voltages. Furthermore, the present invention can output an output voltage with alternate positive and negative polarities. Therefore, when the present invention voltage conversion device is used for converting display data of an LCD monitor, a grayscale curve performed by the LCD monitor can fit in with the brightness identification ability of human eyes, and besides, liquid crystals of the LCD monitor are driven by means of alternate positive and negative polarity voltages.

Therefore, the present invention not only makes image more natural for users but also prevents from the residual image effect and breakage of the liquid crystals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage conversion device having non-linear gain and changeable gain polarity, for converting analog voltage provided by an analog voltage source, the voltage conversion device comprising:
   a switch module coupled to the analog voltage source and a system ground end, for outputting analog voltage provided by the analog voltage source or voltage corresponding to the system ground end according to a polarity selection signal;
   a gain decision module comprising:
      an analog-to-digital (A/D) converter coupled to the analog voltage source, for converting analog voltage provided by the analog voltage source into digital signals; and
      a gain selector coupled to the A/D converter and the switch module, for determining a gain according to the digital signals outputted from the A/D converter;
   a first voltage selection module coupled to the A/D converter, for outputting a first direct-current (DC) voltage selected from a plurality of DC voltages according to the digital signals outputted from the A/D converter;
   a second voltage selection module coupled to the analog voltage source and the A/D converter, for outputting a second DC voltage according to analog voltage provided by the analog voltage source, one of a plurality of DC voltages and the digital signals outputted from the A/D converter;
   a first switch unit coupled to the first voltage selection module, for outputting the first DC voltage according to the polarity selection signal;
   a second switch unit coupled to the second voltage selection module, for outputting the second DC voltage according to an inverse signal corresponding to the polarity selection signal; and
   a voltage output module comprising a first input end, an output end coupled to the gain selector, and a second input end coupled to the first switch unit and the second switch unit, for outputting an amplified result of the DC voltage received by the second input end according to the gain determined by the gain selector.

2. The voltage conversion device of claim 1, wherein the switch module comprises:
   a third switch unit coupled between the analog voltage source and the gain selector, for outputting analog voltage provided by the analog voltage source to the gain selector according to the polarity selection signal; and
   a fourth switch unit coupled between the system ground end and the gain selector, for outputting voltage corresponding to the system ground end to the gain selector according to an inversion signal corresponding to the polarity selection signal.

3. The voltage conversion device of claim 1, wherein the A/D converter comprises:
   a plurality of comparators each having a first input end coupled to the analog voltage source, a second input end coupled to a reference voltage source, and an output end for outputting a comparison result between voltages of the first input end and the second input end; and
   a digital decoding circuit coupled to the plurality of comparators, for outputting the digital signals according to the comparison results outputted from the plurality of comparators.

4. The voltage conversion device of claim 1, wherein the gain selector comprises:
   a first signal end coupled to the output end of the voltage output module;
   a second signal end coupled to the first input end of the voltage output module;
   a third signal end coupled to the switch module;
   a first resistor unit coupled between the first signal end and the second signal end; and
   a resistance decision module coupled to the A/D converter and between the second signal end and the third signal end, for determining resistance between the second signal end and the third signal end according to the digital signals, outputted from the A/D converter, and the polarity selection signal.

5. The voltage conversion device of claim 4, wherein the resistance decision module comprises:
   a plurality of resistors coupled to the third signal end;
   a plurality of first switch units each coupled to the A/D converter and between a second switch unit of the plurality of second switch units and the second signal end, for conducting a connection between the second switch unit and the second signal end according to the digital signals outputted from the A/D converter; and
   a plurality of second switch units each coupled to the polarity selection signal and between a resistor of the plurality of resistors and a first switch unit of the plurality of first switch units, for conducting each connection between each of the plurality of second switch units and a corresponding first switch unit according to the polarity selection signal.

6. The voltage conversion device of claim 4, wherein the resistance decision module comprises:
   a decoding module coupled to the A/D converter, for decoding the digital signals outputted from the A/D converter;
   a plurality of resistors coupled to the second signal end;
   a plurality of first switch units each coupled to the decoding module and between a second switch unit of the plurality of second switch units and the third signal end, for conducting a connection between the second switch unit and the third signal end according to a decoding result outputted from the decoding module; and
   a plurality of second switch units each coupled to the polarity selection signal and between a resistor of the plurality of resistors and a first switch unit of the plurality of first switch units, for conducting each connection between each of the plurality of second switch units and a corresponding first switch unit according to the polarity selection signal.

7. The voltage conversion device of claim 1, wherein the first voltage selection module comprises a plurality of switch units each coupled to the A/D converter and between a DC voltage source of the plurality of the DC voltage sources and the first switch unit, for conducting a connection between the DC voltage source and the first switch unit according to the digital signals outputted from the A/D converter.

8. The voltage conversion device of claim 1, wherein the first voltage selection module comprises:
   a decoding module coupled to the A/D converter, for decoding the digital signals outputted from the A/D converter; and
   a plurality of switch units each coupled to the decoding module and between a DC voltage source of the plurality of the DC voltage sources and the first switch unit, for conducting a connection between the DC voltage source and the first switch unit according to a decoding result outputted from the decoding module.

9. The voltage conversion device of claim 1, wherein the second voltage selection module comprises:
   a first resistor unit having a first end coupled to the second switch unit and a second end;
   a resistance decision module coupled to the A/D converter and between the first end of the first resistor unit and the analog voltage source, for determining resistance between the first end of the first resistor unit and the analog voltage source according to the digital signals outputted from the A/D converter; and
   a DC voltage selection module coupled to the A/D converter and between a plurality of the DC voltage sources and the second end of the first resistor unit, for conducting a connection between one of the plurality of the DC voltage sources and the second end of the first resistor unit according to the digital signals outputted from the A/D converter.

10. The voltage conversion device of claim 9, wherein the resistance decision module comprises:
    a plurality of resistors each coupled to the analog voltage source; and
    a plurality of switch units each coupled to the A/D converter and between a resistor of the plurality of resistors and the first end of the first resistor unit, for conducting a connection between the resistor and the first end of the first resistor unit according to the digital signals outputted from the A/D converter.

11. The voltage conversion device of claim 9, wherein the resistance decision module comprises:
    a decoding module coupled to the A/D converter, for decoding the digital signals outputted from the A/D converter;
    a plurality of resistors each coupled to the analog voltage source; and
    a plurality of switch units each coupled to the decoding module and between a resistor of the plurality of resistors and the first end of the first resistor unit, for conducting a connection between the resistor and the first end of the first resistor unit according to a decoding result outputted from the decoding module.

12. The voltage conversion device of claim 9, wherein the DC voltage selection module comprises a plurality of switch units each coupled to the A/D converter and between a DC voltage source of the plurality of the DC voltage sources and the second end of the first resistor unit, for conducting a connection between the DC voltage source and the second end of the first resistor unit according to the digital signals outputted from the A/D converter.

13. The voltage conversion device of claim 9, wherein the DC voltage selection module comprises:
    a decoding module coupled to the A/D converter, for decoding the digital signals outputted from the A/D converter; and
    a plurality of switch units each coupled to the decoding module and between a DC voltage source of the plurality of the DC voltage sources and the second end of the first resistor unit, for conducting a connection between the DC voltage source and the second end of the first resistor unit according to a decoding result outputted from the decoding module.

14. The voltage conversion device of claim 1, wherein the voltage output module is an operational amplifier.

15. The voltage conversion device of claim 1, wherein the voltage conversion device is used for converting display data of a flat panel display.

16. A voltage conversion device having non-linear gain and changeable gain polarity, for converting analog voltage provided by an analog voltage source, the voltage conversion device comprising:
    a switch module coupled to the analog voltage source and a plurality of direct-current (DC) voltage sources, comprising a first output end and a second output end, for determining to output analog voltage provided by the analog voltage source from the first output end and one of the DC voltage sources from the second output end, or to output one of the DC voltage sources from the first output end and analog voltage provided by the analog voltage source from the second output end according to a polarity selection signal;
    a gain decision module comprising:
       an analog-to-digital (A/D) converter coupled to the analog voltage source, for converting analog voltage provided by the analog voltage source into digital signals; and
       a gain selector coupled to the A/D converter and the first output end of the switch module, for determining a gain according to the digital signals outputted from the A/D converter and voltage outputted from the first output end of the switch module; and
    a voltage output module comprising a first input end, an output end coupled to the gain selector, and a second input end coupled to the second output end of the switch module, for outputting an amplified result of the DC voltage received by the second input end according to the gain determined by the gain selector.

17. The voltage conversion device of claim 16, wherein the A/D converter comprises:
    a plurality of comparators each having a first input end coupled to the analog voltage source, a second input end coupled to a reference voltage source, and an output end for outputting a comparison result between voltages of the first input end and the second input end; and
    a digital decoding circuit coupled to the plurality of comparators, for outputting the digital signals according to the comparison result outputted from the plurality of comparators.

18. The voltage conversion device of claim 16, wherein the gain selector comprises:
    a first signal end coupled to the output end of the voltage output module;
    a second signal end coupled to the first input end of the voltage output module;
    a third signal end coupled to the first output end of the switch module;
    a first resistor unit coupled between the first signal end and the second signal end; and
    a resistance decision module coupled to the A/D converter and between the second signal end and the third signal end, for determining resistance between the second signal end and the third signal end according to the digital signals, outputted from the A/D converter, and the polarity selection signal.

19. The voltage conversion device of claim 18, wherein the resistance decision module comprises:
- a plurality of resistors coupled to the third signal end;
- a plurality of first switch units each coupled to the A/D converter and between a second switch unit of the plurality of second switch units and the second signal end, for conducting a connection between the second switch unit and the second signal end according to the digital signals outputted from the A/D converter; and
- a plurality of second switch units each coupled to the polarity selection signal and between a resistor of the plurality of resistors and a first switch unit of the plurality of first switch units, for conducting each connection between each of the plurality of second switch units and a corresponding first switch unit according to the polarity selection signal.

20. The voltage conversion device of claim 18, wherein the resistance decision module comprises:
- a decoding module coupled to the A/D converter, for decoding the digital signals outputted from the A/D converter;
- a plurality of resistors coupled to the second signal end;
- a plurality of first switch units each coupled to the decoding module and between a second switch unit of the plurality of second switch units and the third signal end, for conducting a connection between the second switch unit and the third signal end according to a decoding result outputted from the decoding module; and
- a plurality of second switch units each coupled to the polarity selection signal and between a resistor of the plurality of resistors and a first switch unit of the plurality of first switch units, for conducting each connection between each of the plurality of second switch units and a corresponding first switch unit according to the polarity selection signal.

21. The voltage conversion device of claim 16, wherein the voltage output module is an operational amplifier.

22. The voltage conversion device of claim 16, wherein the voltage conversion device is used for converting display data of a flat panel display.

* * * * *